(12) United States Patent
Jin et al.

(10) Patent No.: US 9,521,345 B2
(45) Date of Patent: Dec. 13, 2016

(54) DATA TRANSMISSION CIRCUIT, IMAGE SENSOR INCLUDING THE SAME

(71) Applicant: SAMSUNG ELECTRONICS CO., LTD., Suwon-Si, Gyeonggi-Do (KR)

(72) Inventors: Eun-Young Jin, Hwaseong-Si (KR);
Hyuk-Bin Kwon, Seoul (KR);
Dae-Hwa Paik, Seoul (KR);
Chang-Eun Kang, Seoul (KR);
Won-Ho Choi, Suwon-Si (KR);
Young-Tae Jang, Pyeongtaek-Si (KR);
Ji-Hun Shin, Seongnam-Si (KR);
Young-Kyun Jeong, Hwaseong-Si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 43 days.

(21) Appl. No.: 14/559,854

(22) Filed: Dec. 3, 2014

(65) Prior Publication Data

US 2015/0163431 A1 Jun. 11, 2015

(30) Foreign Application Priority Data

Dec. 5, 2013 (KR) .......... 10-2013-0150708
Nov. 28, 2014 (KR) .......... 10-2014-0168781

(51) Int. Cl.
*H04N 5/378* (2011.01)
*H04N 5/376* (2011.01)

(52) U.S. Cl.
CPC ............ *H04N 5/378* (2013.01); *H04N 5/3765* (2013.01)

(58) Field of Classification Search
CPC .............................. H04N 5/378; H04N 5/3765
See application file for complete search history.

(56) References Cited

U.S. PATENT DOCUMENTS

| | | | |
|---|---|---|---|
| 7,230,649 B2 | 6/2007 | Takahashi et al. | |
| 7,903,160 B2 * | 3/2011 | Taguchi | H04N 5/335 348/308 |
| 8,072,522 B2 | 12/2011 | Taura | |
| 8,093,934 B2 | 1/2012 | Hatano et al. | |
| 8,208,053 B2 | 6/2012 | Nishihara | |
| 8,319,522 B2 | 11/2012 | Takahashi | |
| 8,319,850 B2 | 11/2012 | Nishihara | |
| 8,446,506 B2 | 5/2013 | Nakamura | |
| 8,471,615 B2 | 6/2013 | Hatano et al. | |
| 2012/0086832 A1 | 4/2012 | Ruhman et al. | |
| 2012/0182450 A1 | 7/2012 | Sato et al. | |
| 2013/0070118 A1 | 3/2013 | Hatano et al. | |

* cited by examiner

*Primary Examiner* — Tony Ko
(74) *Attorney, Agent, or Firm* — Volentine & Whitt, PLLC

(57) ABSTRACT

A data transmission circuit includes a data output unit (DOU) connected to a positive data transmission line and a negative data transmission line. The DOU generates a recovered data signal based on data signals communicated via the positive and negative data transmission lines. Data signal driving units are respectively connected at different points along the positive and negative data transmission lines, where each data signal driving unit generates and provides a positive data signal and a negative data signal based on a data input signal and a data transmission distance between the data signal driving unit and the data output unit.

17 Claims, 30 Drawing Sheets

DDU1b

DDU1c

DATA TRANSMISSION CIRCUIT, IMAGE SENSOR INCLUDING THE SAME

CROSS-REFERENCE TO RELATED APPLICATION

This U.S. non-provisional application claims priority under 35 USC §119 to Korean Patent Application No. 10-2013-0150708 filed on Dec. 5, 2013 and Korean Patent Application No. 10-2014-0168781 filed on, Nov. 28, 2014, the subject matter of which is hereby incorporated by reference.

BACKGROUND

Embodiments of the inventive concept relate generally to data transmission approaches, data transmission circuits, image sensors including a data transmission circuit, and methods of transmitting data.

Various commercial applications and consumer electronics include one or more image sensors configured to acquire digital image data. Upon acquisition, the image data is stored in various data storage devices until retrieve (e.g.,) in response to a user input. When image data is retrieved from certain semiconductor memory devices, its provision may suffer difficulties arising from variable resistance-capacitance (RC) delay times respectively associated with different memory cells storing the image data. That is, one RC delay time may influence the communication of first image data stored in a first memory cell disposed relatively far from a data output unit of the image sensor, while another RC delay time may influence the communication of second image data stored in a second memory cell disposed relatively near the data output unit. As the fabrication size of image sensors increases, operating speed may be adversely affected by variable RC delay times.

SUMMARY

Certain embodiments of the inventive concept provide a data transmission circuit including a data signal driving unit that reduces differences among RC delay times for transmitting image data.

According to certain embodiments of the inventive concept, a data transmission circuit includes; a positive data transmission line and a negative data transmission line, a data output unit connected to the positive data transmission line and negative data transmission line and configured to generate a recovered data signal based on data signals communicated via the positive data transmission line and negative data transmission line, and a plurality of data signal driving units respectively connected at different points along the positive data transmission line and negative data transmission line, each data signal driving unit being configured to generate a positive data signal and a negative data signal based on a data input signal and a data transmission distance between the data signal driving unit and the data output unit, and provide the positive data signal to the positive data transmission line and the negative data signal to the negative data transmission line.

According to other embodiments of the inventive concept, a data transmission circuit includes; a positive data transmission line and a negative data transmission line, a data output unit connected to the positive data transmission line and negative data transmission line and configured to generate a recovered data signal based on data signals communicated via through the positive data transmission line and negative data transmission line, a plurality of data signal driving units respectively connected at different points along the positive data transmission line and negative data transmission line, and a plurality of pull-up devices respectively corresponding on a one-for-one basis with one of the plurality of data signal driving units and being connected at the different points along the positive data transmission line and negative data transmission line, wherein each data signal driving unit provides a positive data signal to the positive data transmission line and a negative data signal to the negative data transmission line, and each pull-up device provides a positive pull-up signal to the positive data transmission line and a negative pull-up signal to the negative data transmission line, at least one of the relative strengths of the respective positive data signals, negative data signals, positive pull-up signals, and negative pull-up signals is adjusted according to one of a number of data transmission distances respectively associated with each one of the plurality of data signal driving units and the data output unit.

According to other embodiments of the inventive concept, an image sensor includes; a pixel array configured to generate analog signals representing a captured image, a signal processor configured to convert the analog signals to first and second digital signals, a first positive data transmission line, a first negative data transmission line, a first data output unit connected to the first positive data transmission line and first negative data transmission line and configured to generate a first recovered data signal based on data signals communicated via the first positive data transmission line and first negative data transmission line, and a data signal driving circuit including first through (M)-th data signal driving units (M is a natural number) respectively connected at different points along the first positive data transmission line and first negative data transmission line. The (K)-th data signal driving unit (K is a natural number which is less than or equal to M) is configured to generate at least one (K)-th positive data signal and at least one (K)-th negative data signal based on at least one (K)-th digital signal among the first digital signals and a data transmission distance between the (K)-th data signal driving unit and the first data output unit, and provide the at least one (K)-th positive data signal to the first positive data transmission line and the at least one (K)-th negative data signal to the first negative data transmission line.

BRIEF DESCRIPTION OF THE DRAWINGS

Embodiments of the inventive concept will be more clearly understood from the following detailed description taken in conjunction with the accompanying drawings.

DETAILED DESCRIPTION OF EMBODIMENTS

Figure 1:
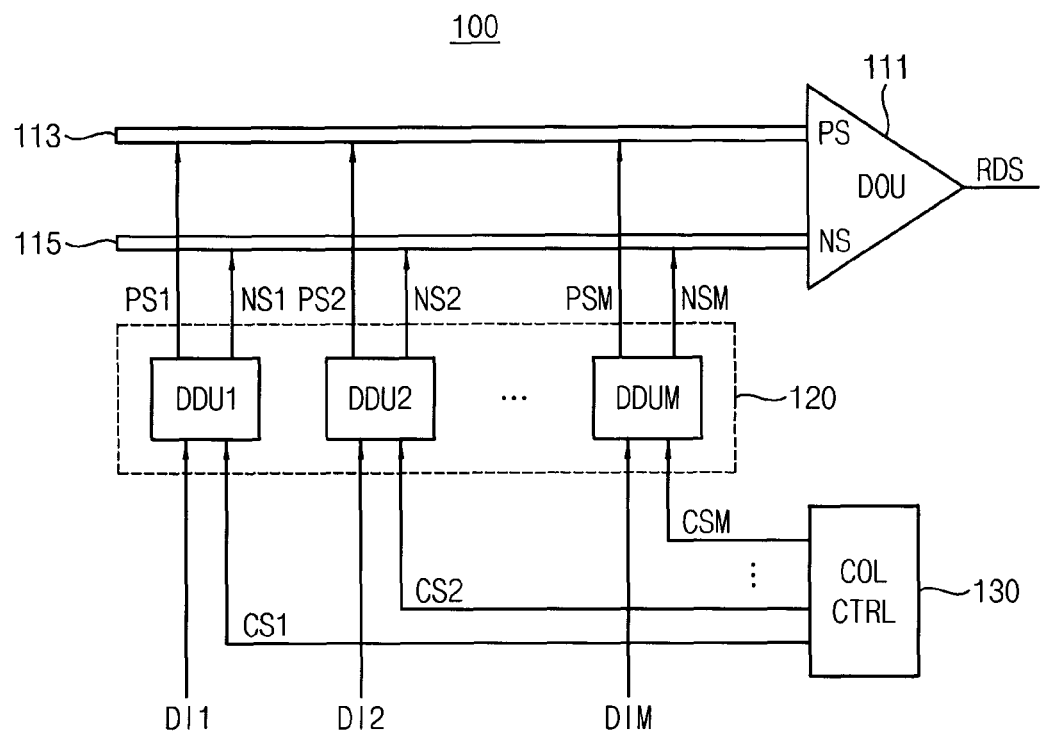
FIG. 1 is a block diagram illustrating in one example a data transmission circuit according to an embodiment of the inventive concept.

Certain embodiments of the inventive concept will now be described in some additional detail with reference to the accompanying drawings. The inventive concept may, however, be embodied in many different forms and should not be construed as being limited to only the illustrated embodiments. Rather, these embodiments are provided so that this disclosure will be thorough and complete, and will fully convey the scope of the present inventive concept to those skilled in the art. Throughout the written description and drawings, like reference numbers and labels are used to denote like or similar elements.

It will be understood that, although the terms first, second, third etc. may be used herein to describe various elements, these elements should not be limited by these terms. These terms are used to distinguish one element from another. Thus, a first element discussed below could be termed a second element without departing from the teachings of the present inventive concept. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted in the blocks may occur out of the order noted in the flowcharts. For example, two blocks shown in succession may in fact be executed substantially concurrently or the blocks may sometimes be executed in the reverse order, depending upon the functionality/acts involved.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a block diagram illustrating a data transmission circuit according to an embodiment of the inventive concept.

Referring to FIG. 1, a data transmission circuit 100 comprises a positive data transmission line 113, a negative data transmission line 115, a data output unit DOU 111 and a data signal driving circuit 120. The data signal driving circuit 120 illustrated in FIG. 1 includes an arrangement of respective data signal driving units (e.g., first data signal driving unit, DDU1, second data signal driving unit DDU2, through an (M)-th data signal driving unit DDUM). The data output unit DOU 111 may be used to generate a recovered data signal RDS based on signals transferred via the positive data transmission line 113 and/or the negative data transmission line 115. The respective data signal driving units DDU1, DDU2, through DDUM are connected at different points along the positive data transmission line 113 and negative data transmission line 115. The first data signal driving unit may be used to generate a first positive data signal PS1 and a first negative data signal NS1 based on a first data input signal DI1 and a first data transmission distance between the first data signal driving unit DDU1 and the data output unit DOU 111. Thus, the first data signal driving unit DDU1 respectively provides the first positive data signal PS1 and first negative data signal NS1 to the positive data transmission line 113 and the negative data transmission line 115. In similar manner, the second data signal driving unit DDU2 may be used to generate a second positive data signal PS2 and a second negative data signal NS2 based on a second data input signal DI2 and a data transmission distance between the second data signal driving unit DDU2 and the data output unit 111. And similarly, the second data signal driving unit DDU2 respectively provides the second positive data signal PS2 and second negative data signal NS2 to the positive data transmission line 113 and negative data transmission line 115. Additional and successively arranged data signal driving units (through an (M)-th data signal driving unit DDUM) may be similarly configured.

The data transmission circuit 100 illustrated in FIG. 1 may further comprise a plurality of pull-up devices that are connected at different points along the positive data transmission line 113 and negative data transmission line 115 respectively. In one configuration, location of the respective the pull-up devices corresponds to that of the data signal driving units DDU1, DDU2, and DDUM. That is, each pull-up device may correspond to a data signal driving unit. The pull-up device may be used to generate a positive pull-up signal and a negative pull-up signal based on the particular data transmission distance between the corresponding data signal driving unit and the data output unit DOU 111. For example, a pull-up device may be used to respectively provide a positive pull-up signal and a negative pull-up signal to the positive data transmission line 113 and negative data transmission line 115. One example of a specific pull-up device that may be used in this arrangement will be described in some additional detail with the reference to FIG. 13.

The data signal driving units DDU1, DDU2, through DDUM may be further configured to operate sequentially based on data driving control signals CS1, CS2, through CSM as provide by a data driving controller COL CTRL 130. In the illustrated embodiment of FIG. 1, the respective data driving control signals CS1, CS2, through CSM may be sequentially enabled in arranged order (or in a reverse order) by the data driving controller COL CTRL 130. Examples of particular data driving control signals CS1, CS2, and CSM that may be used in this arrangement will be described in some additional detail with reference to FIGS. 10, 11 and 12.

Certain examples of the first data signal driving unit DDU1 will be described in some additional detail with the reference to FIGS. 2, 3, 4, 5 and 6. Certain examples of the data signal driving circuit 120 including data signal driving units DDU1, DDU2, through DDUM will be described in some additional detail with reference to FIGS. 7, 8 and 9.

In the illustrated embodiment of FIG. 1, the recovered data signal RDS includes recovered data input signals DI1, DI2 through DIM and will be described in some additional detail with the reference to FIG. 19.

FIGS. 2, 3, 4, 5 and 6 are respective circuit diagrams illustrating possible embodiments that may be used to implement any one, some, or all of the data signal driving units (e.g., DDU1 through DDUM) included in the data transmission circuit 100 of FIG. 1. However, a first data signal driving unit DDU1*a* will be assumed as a working example.

Figure 2:
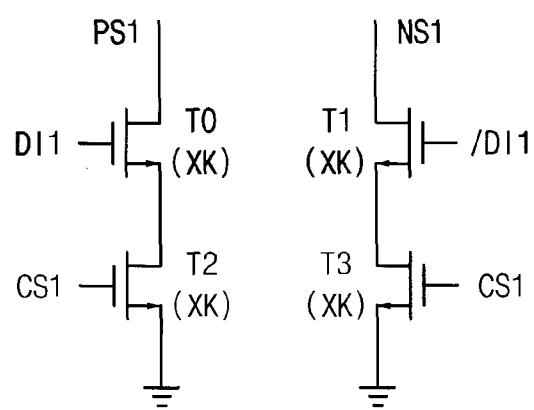
FIGS. 2, 3, 4, 5 and 6 are circuit diagrams further illustrating in different examples the first data signal driving unit of FIG. 1.

Referring to FIG. 2, the first data signal driving unit DDU1*a* comprises a first driving transistor T0, a second driving transistor T1, a third driving transistor T2, and a fourth driving transistor T3, where the drain terminal of the first driving transistor T0 outputs the first positive data signal PS1 and the first data input signal DI1 is provided to the gate terminal of the first driving transistor T0. The source terminal of the first driving transistor T0 is electrically connected to the drain terminal of the third driving transistor T2. The drain terminal of the second driving transistor T1 outputs the first negative data signal NS1 and an inverted first data input signal /DI1 is provided to the gate terminal of the second driving transistor T1. The source terminal of the second driving transistor T1 is electrically connected to the drain terminal of the fourth driving transistor T3. The drain terminal of the third driving transistor T2 is electrically connected to the source terminal of the first driving transistor T0. The data driving control signal CS1 is provided to the gate terminal of the third driving transistor T2. The source terminal of the third driving transistor T2 is electrically connected to ground. The drain terminal of the fourth driving transistor T3 is electrically connected to the source terminal of the second driving transistor T1. The data driving control signal CS1 is provided to the gate terminal of the fourth driving transistor T3, and the source terminal of the fourth driving transistor T3 is electrically connected to ground.

The respective and relative strength of the first positive data signal PS1 and the negative data signal NS1 may be controlled according to the respective sizes of the driving transistors T0, T1, T2, and T3 included in the first data signal driving unit DDU1*a*. That is, the driving transistors T0, T1, T2, and T3 may be embodied as respective metal-oxide-semiconductor field-effect transistors (MOSFETs), where the "size" of each MOSFET may generally be expressed as a ratio between a channel width (W) of the MOSFET and a channel length (L) of the MOSFET.

In one embodiment of the inventive concept, the size of the first driving transistor T0, second driving transistor T1, third driving transistor T2, and fourth driving transistor T3 may be K times greater than a size of a unit driving transistor. Under this assumption, the strength of the first positive data signal PS1 and first negative data signal NS1 generated by the first data signal driving unit DDU1*a* including the driving transistors T0, T1, T2, and T3 will be about K times higher than the strength of the first positive data signal PS1 and first negative data signal NS1 generated by the first data signal driving unit DDU1*a* when the driving transistors T0, T1, T2, and T3 are sized according to the unit driving transistor. Thus, the strength of the first positive data signal PS1 and the first negative data signal NS1 may be equivalent to the current intensity of the first positive data signal PS1 and the first negative data signal NS1.

Figure 3:
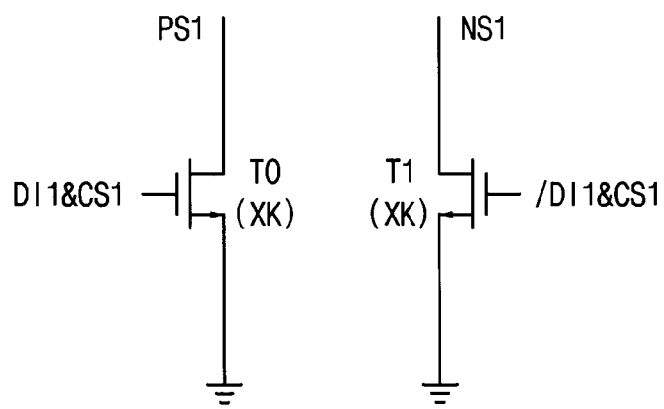

Referring to FIG. 3, a first data signal driving unit DDU1*b* comprises a first driving transistor T0 and a second driving transistor T1. The drain terminal of the first driving transistor T0 outputs the first positive data signal PS1. A logic signal derived by ANDing the first data input signal DI1 with the first data driving control signal CS1 is provided to the gate terminal of the first driving transistor T0. The source terminal of the first driving transistor T0 is electrically connected to ground. The drain terminal of the second driving transistor T1 outputs the first negative data signal NS1. A logic signal derived by ANDing the inverted first data input signal /DI1 and the first data driving control signal CS1 is provided to the gate terminal of the second driving transistor T1. The source terminal of the second driving transistor T1 is electrically connected to ground.

Here, the size of the first driving transistor T0 and the second driving transistor T1 may be K times greater than the size of the unit driving transistor. Accordingly, the strength of the first positive data signal PS1 and the first negative data signal NS1 generated by the first data signal driving unit DDU1*b* including the driving transistors T0, T1 which have K times greater sizes than the unit driving transistor will be K times higher than the strength of the first positive data signal PS1 and the first negative data signal NS1 generated by the first data signal driving unit DDU1*b* including the driving transistors T0, T1 which have the same sizes as the unit driving transistor.

Figure 4:
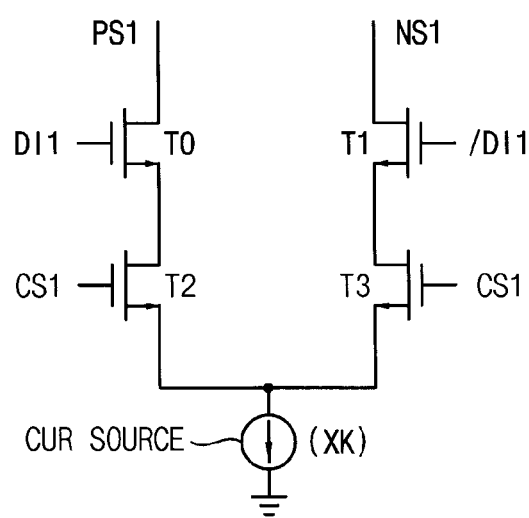

Referring to FIG. 4, a first data signal driving unit DDU1*c* comprises a first driving transistor T0, a second driving transistor T1, a third driving transistor T2, a fourth driving transistor T3, and a current source CUR SOURCE. The drain terminal of the first driving transistor T0 outputs the first positive data signal PS1. The first data input signal DI1 is provided to the gate terminal of the first driving transistor T0. The source terminal of the first driving transistor T0 is electrically connected to the drain terminal of the third driving transistor T2.

The drain terminal of the second driving transistor T1 outputs the first negative data signal NS1. The inverted first data input signal /DI1 is provided to the gate terminal of the second driving transistor T1. The source terminal of the second driving transistor T1 is electrically connected to the drain terminal of the fourth driving transistor T3. The drain terminal of the third driving transistor T2 is electrically connected to the source terminal of the first driving transistor T0. The first data driving control signal CS1 is provided to the gate terminal of the third driving transistor T2. The source terminal of the third driving transistor T2 is electrically connected to the terminal of the current source CUR SOURCE. The drain terminal of the fourth driving transistor T3 is electrically connected to the source terminal of the second driving transistor T1. The first data driving control signal CS1 is provided to the gate terminal of the fourth driving transistor T3. The source terminal of the fourth driving transistor T3 is electrically connected to the terminal of the current source CUR SOURCE, where the other terminal of the current source CUR SOURCE may be electrically connected to ground.

The strength of the first positive data signal PS1 and the first negative data signal NS1 may be controlled according to the strength of the current source CUR SOURCE included in the first data signal driving unit DDU1c. That is, the strength of the first positive data signal PS1 and first negative data signal NS1 generated by the first data signal driving unit DDU1c including the current source CUR SOURCE which has K times higher current intensity than the unit current source will be K times higher than the strength of the first positive data signal PS1 and first negative data signal NS1 generated by the first data signal driving unit DDU1c including the unit current source.

Figure 5:
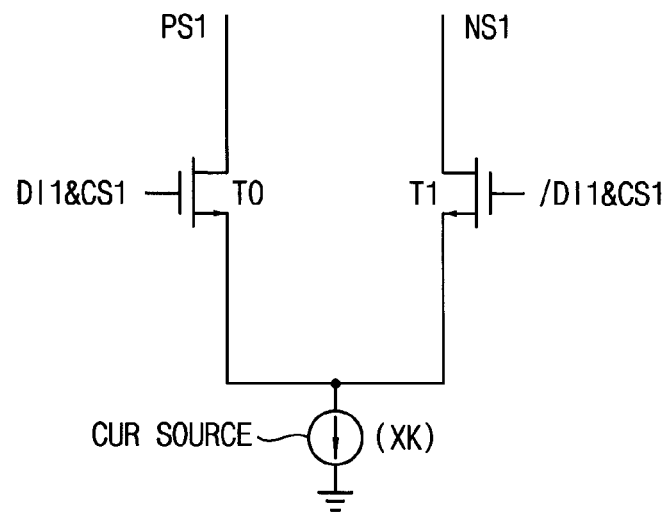

Referring to FIG. 5, a first data signal driving unit DDU1d comprises a first driving transistor T0 and a second driving transistor T1. The drain terminal of the first driving transistor T0 outputs the first positive data signal PS1. A logic signal derived by ANDing the first data input signal DI1 and first data driving control signal CS1 is provided to the gate terminal of the first driving transistor T0. The source terminal of the first driving transistor T0 is electrically connected to a terminal of a current source CUR SOURCE. The drain terminal of the second driving transistor T1 outputs the first negative data signal NS1. A logic signal derived by ANDing the inverted first data input signal /DI1 and the first data driving control signal CS1 is provided to the gate terminal of the second driving transistor T1. The source terminal of the second driving transistor T1 is electrically connected to the terminal of the current source CUR SOURCE. The other terminal of the current source CUR SOURCE is electrically connected to ground.

Here again, the strength of the first positive data signal PS1 and the first negative data signal NS1 generated by the first data signal driving unit DDU1d including the current source CUR SOURCE which have K times higher current intensity than the unit current source will be K times higher than the strength of the first positive data signal PS1 and the first negative data signal NS1 generated by the first data signal driving unit DDU1d including the unit current source.

Figure 6:
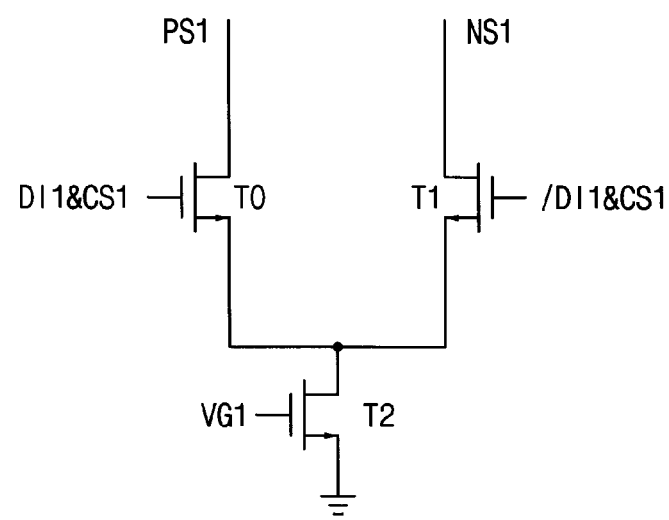

Referring to FIG. 6, a first data signal driving unit DDU1e comprises a first driving transistor T0, a second driving transistor T1, and a third driving transistor T2. The drain terminal of the first driving transistor T0 outputs the first positive data signal PS1. A logic signal derived by ANDing the first data input signal DI1 and the first data driving control signal CS1 is provided to the gate terminal of the first driving transistor T0. The source terminal of the first driving transistor T0 is electrically connected to the drain terminal of the third driving transistor T2. The drain terminal of the second driving transistor T1 outputs the first negative data signal NS1. A logic signal derived by ANDing the inverted first data input signal /DI1 and the first data driving control signal CS1 is provided to the gate terminal of the second driving transistor T1. The source terminal of the second driving transistor T1 is electrically connected to the drain terminal of the third driving transistor T2. The drain terminal of the third driving transistor T2 is electrically connected to the source terminal of the first driving transistor T0 and the source terminal of the second driving transistor T1. A power control signal VG1 is provided to the gate terminal of the third driving transistor T2, and the source terminal of the third driving transistor T2 is electrically connected to ground.

The strength of the first positive data signal PS1 and the strength of the first negative data signal NS1 may be controlled by voltage signals provided to the gate terminals of the driving transistors T0, T1, T2 included in the first data signal driving unit DDU1e. When the third driving transistor T2 operates outside of saturation mode and voltage level of the power control signal VG1 is increased, the strength of the first positive data signal PS1 and the first negative data signal NS1 generated by the first data signal driving unit DDU1e will increase accordingly.

Figure 7:
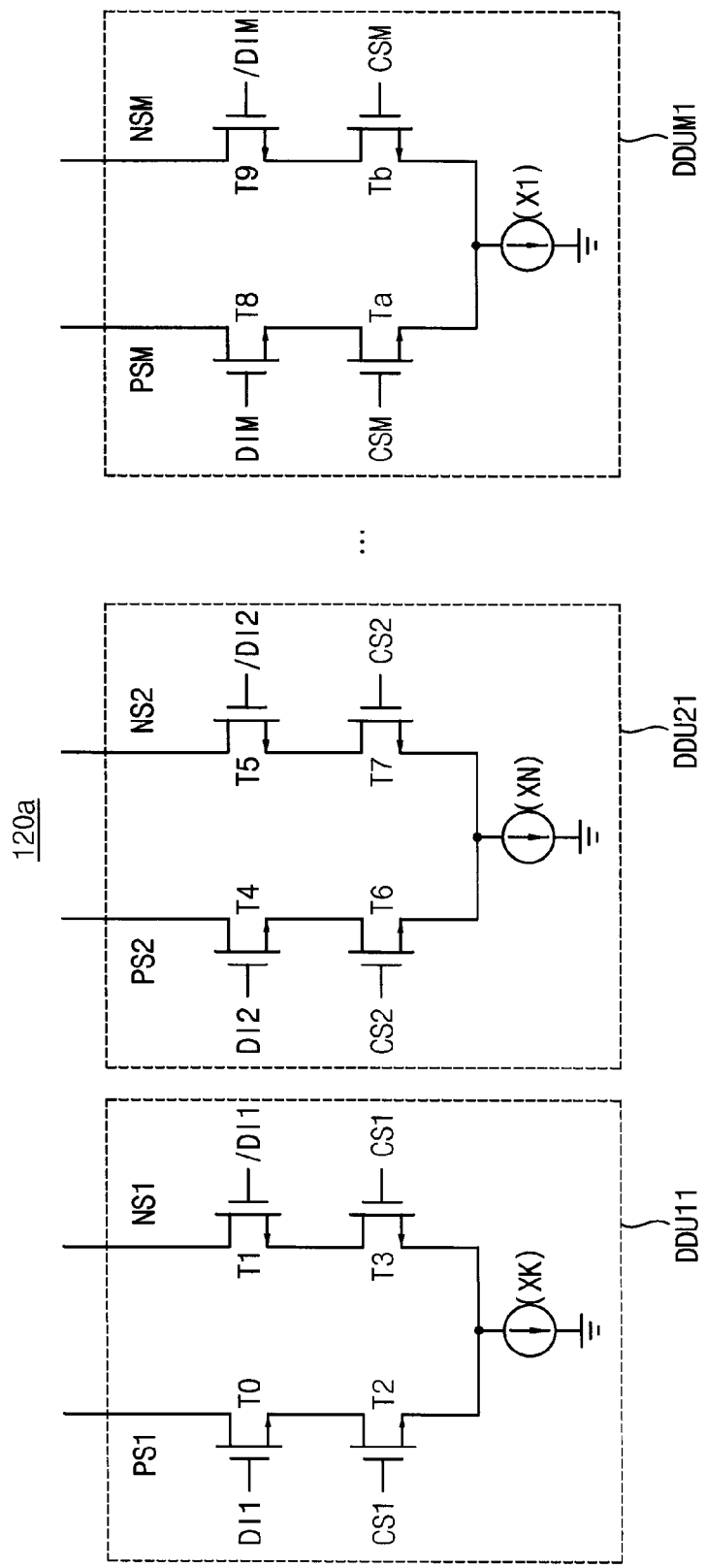
FIGS. 7, 8 and 9 are circuit diagrams further illustrating in different examples the data signal driving circuit of FIG. 1.
Figure 8:
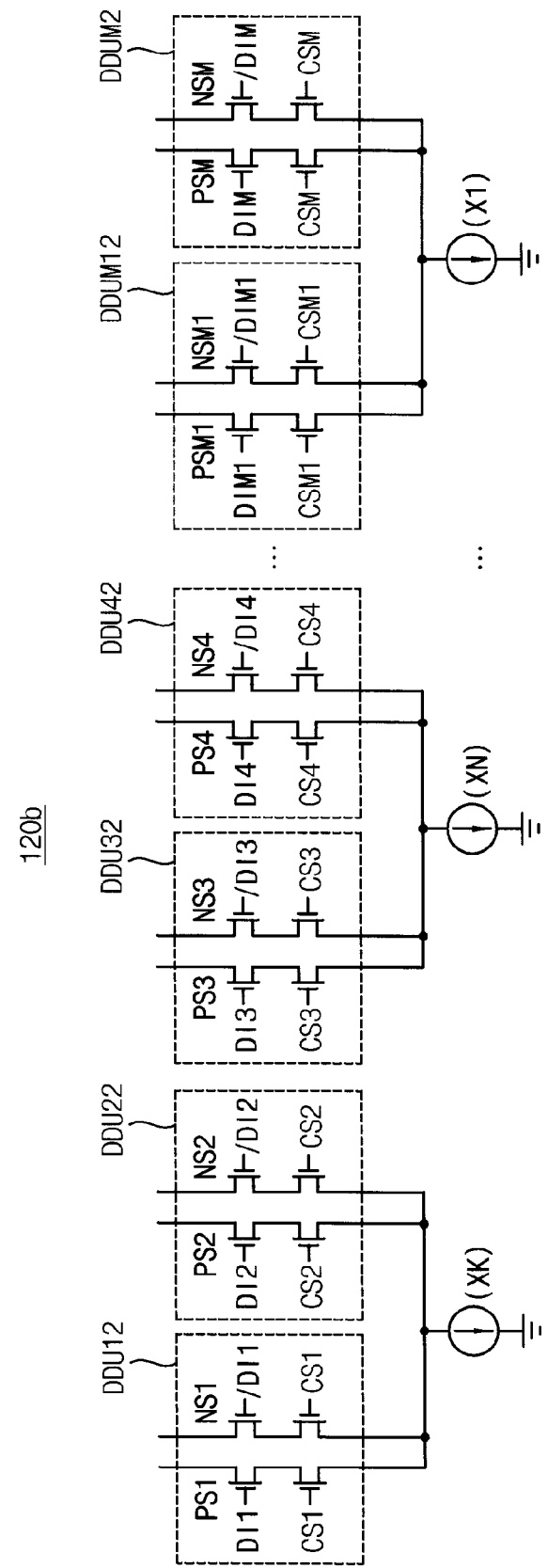
Figure 9:
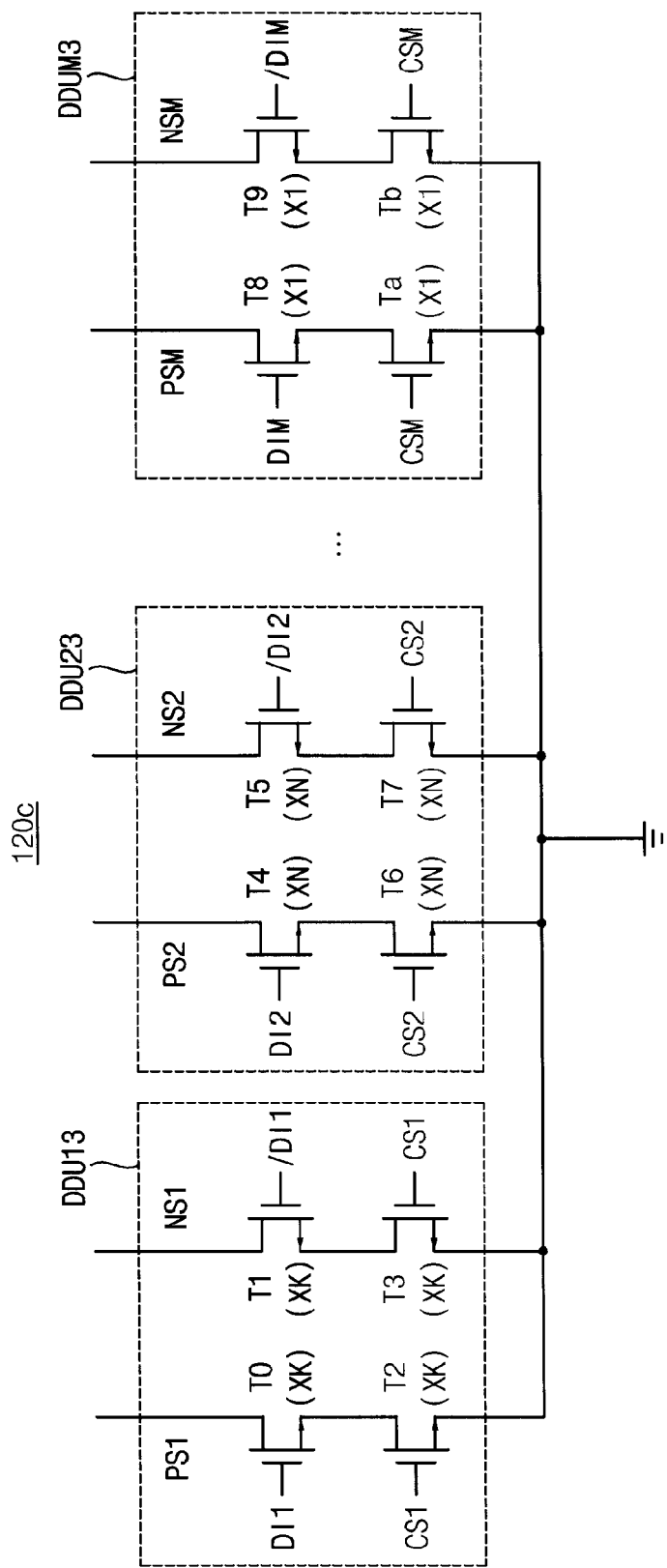

FIGS. 7, 8 and 9 are respective circuit diagrams illustrating different possible embodiments of the data signal driving circuit 120 included in the data transmission circuit 100 of FIG. 1.

Referring to FIG. 7, a data signal driving circuit 120a comprises a first data signal driving unit DDU11, a second data signal driving unit DDU21, through an (M)-th data signal driving unit DDUM1. Here, each of the first data signal driving unit DDU11, the second data signal driving unit DDU21, through the (M)-th data signal driving unit DDUM1 is assumed to have the same configuration as the first data signal driving unit DDU1c shown in FIG. 4, wherein the strength of the first positive data signal PS1 and the first negative data signal NS1 are defined according to the strength of the current source. In particular, the strength of a current source included in the first data signal driving unit DDU11 is assumed to be K times higher than the strength of a current source included in the (M)-th data signal driving unit DDUM1, and the strength of a current source included in the second data signal driving unit DDU21 is assumed to be N time higher than the strength of the current source included in the (M)-th data signal driving unit DDUM1, where 'N' is less than 'K'.

As a result, the strength of the positive data signals PS1, PS2, and PSM and strength of the negative data signals NS1, NS2, NSM may be made proportional with a corresponding data transmission distance for each data signal driving unit. That is, the distance from the first data signal driving unit DDU11 to the data output unit DOU 111 is greater than the distance from the second data signal driving unit DDU21 to the data output unit DOU 111, and the distance from the second data signal driving unit DDU21 to the data output unit DOU 111 is greater than the distance from the (M)-th data signal driving unit DDUM1 to the data output unit DOU 111.

Thus, in the data signal driving circuit 120a of FIG. 7 respective strengths of the positive data signals PS1, PS2, and PSM, and the respective strengths of the negative data signals NS1, NS2, and NSM increase in proportion with corresponding distances between each data signal driving units DDU11, DDU21, through DDUM1 and the data output unit DOU 111. These differing signal strengths may be effectively controlled by defining relative strengths of the current sources respectively included in the data signal driving circuit 120a.

Referring to FIG. 8, a data signal driving circuit 120b comprises a first data signal driving unit DDU12, a second data signal driving unit DDU22, a third data signal driving unit DDU32, a fourth data signal driving unit DDU42, an (M−1)-th data signal driving unit DDUM11, and an (M)-th data signal driving unit DDUM2. Each of the data signal driving units DDU12, DDU22, DDU32, DDU42, DDUM12, and DDUM2 is assumed to have the same configuration described with respect to the first data signal driving unit DDU1c of FIG. 4. Here, the strength of a current source connected to the first data signal driving unit DDU12 and the second data signal driving unit DDU22 is K times higher than the strength of a current source connected to the (M−1)-th data signal driving unit DDU12 and the (M)-th data signal driving unit DDUM2, and the strength of a current source connected to the third data signal driving unit DDU32 and the fourth data signal driving unit DDU42 is N times higher than the strength of the current source connected to the (M−1)-th data signal driving unit DDUM12 and the (M)-th data signal driving unit DDUM2, where 'N' is less than 'K'.

Because the first data signal driving unit DDU12 and the second data signal driving unit DDU22 are connected to the same current source, the strength of the first positive data signal PS1 is the same as a strength of the second positive data signal PS2, and a strength of the first negative data signal NS1 is the same as a strength of the second negative data signal NS2. Because the third data signal driving unit DDU32 and the fourth data signal driving unit DDU42 are connected to the same current source, the strength of the third positive data signal PS3 is the same as the strength of the fourth positive data signal PS4, and the strength of the third negative data signal NS3 is the same as the strength of the fourth negative data signal NS4. Because the (M−1)-th data signal driving unit DDUM12 and the (M)-th data signal driving unit DDUM2 are connected to the same current source, the strength of the (1)-th positive data signal PSM1 is the same as the strength of the (M)-th positive data signal PSM, and the strength of the (M−1)-th negative data signal NSM1 is the same as the strength of the (M)-th negative data signal NSM.

A distance between the first data signal driving unit DDU12 and the second data signal driving unit DDU22 and the data output unit DOU 111 is greater than the distance between the third data signal driving unit DDU32 and the fourth data signal driving unit DDU42 and the data output unit DOU 111, and the distance between the third data signal driving unit DDU32 and the fourth data signal driving unit DDU42 and the data output unit DOU 111 is greater than the distance between the (M−1)-th data signal driving unit DDUM12 and the (M)-th data signal driving unit DDUM2 and the data output unit DOU 111.

Thus, in the data signal driving circuit 120b of FIG. 8 the relative strengths of the positive data signals PS1, PS2, PS3, PS4, PSM1, and PSM and the relative strengths of the negative data signals NS1, NS2, NS3, NS4, NSM1, and NSM will increase in proportion with the distances from the data signal driving units DDU12, DDU22, DDU32, DDU42, DDUM12, and DDUM2 and the data output unit DOU 111. Again this result may be accomplished by controlling the strength of the respective common current sources included in the data signal driving circuit 120b.

Referring to FIG. 9, a data signal driving circuit 120c comprises a first data signal driving unit DDU13, a second data signal driving unit DDU23, an (M)-th data signal driving units DDUM3. Each of the data signal driving units DDU13, DDU23, and DDUM3 is assumed to have the same configuration described in relation to the first data signal driving unit DDU1a of FIG. 2. However, the size of each of the first driving transistor T0, second driving transistor T1, third driving transistor T2, and fourth driving transistor T3 included in the first data signal driving unit DDU13 are K times greater than the size of each of the ninth driving transistor T8, tenth driving transistor T9, eleventh driving transistor Ta, and twelfth driving transistor Tb included in the (M)-th data signal driving unit DDUM3, respectively.

The size of each of the fifth driving transistor T4, sixth driving transistor T5, seventh driving transistor T6, and eighth driving transistor T7 included in the second data signal driving unit DDU23 is N times greater than the size of the ninth driving transistor T8, tenth driving transistor T9, eleventh driving transistor Ta, and twelfth driving transistor Tb included in the (M)-th data signal driving unit DDUM3, respectively.

Thus as before, in the data signal driving circuit 120c of FIG. 9, the relative strengths of the positive data signals PS1, PS2, and PSM and the relative strengths of the negative data signals NS1, NS2, and NSM increase in proportion with corresponding distances from the data signal driving units DDU13, DDU23, DDUM3 to the data output unit DOU 111 by controlling size of the driving transistors T0 through Ta respectively included in the data signal driving circuit 120c.

Figure 10:
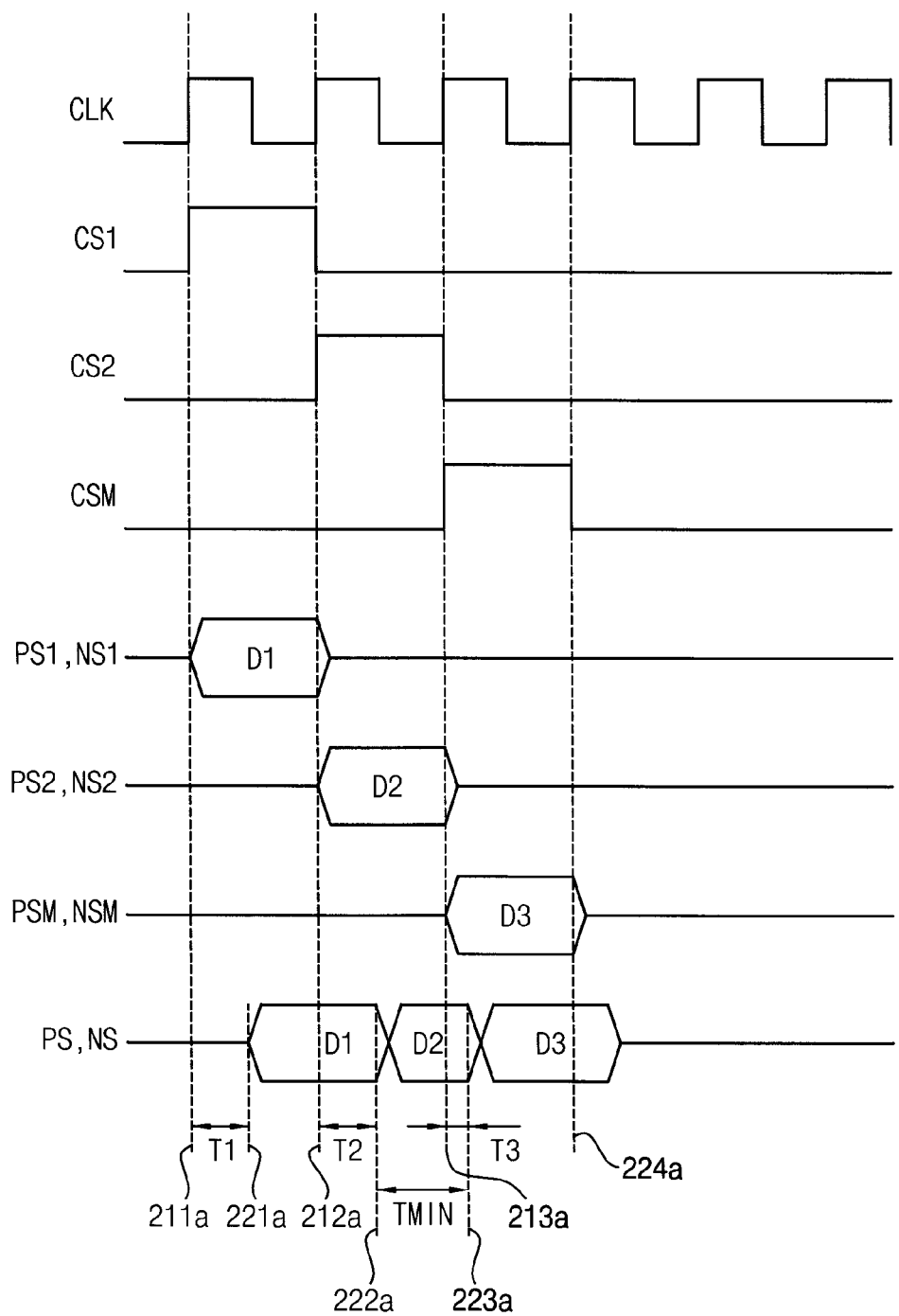
FIGS. 10, 11 and 12 are respective timing diagrams illustrating exemplary operation of the data transmission circuit of FIG. 1.
Figure 11:
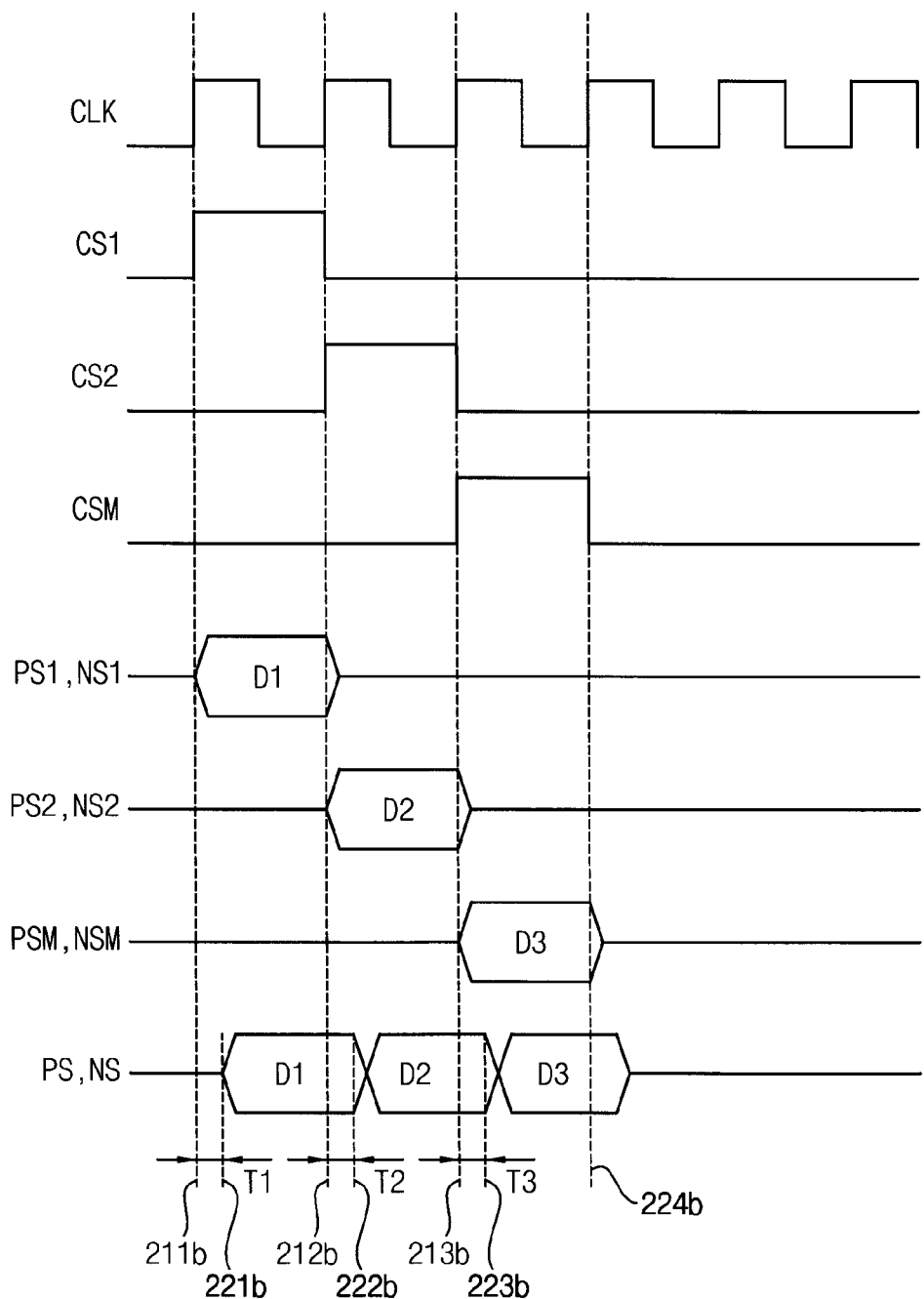
Figure 12:
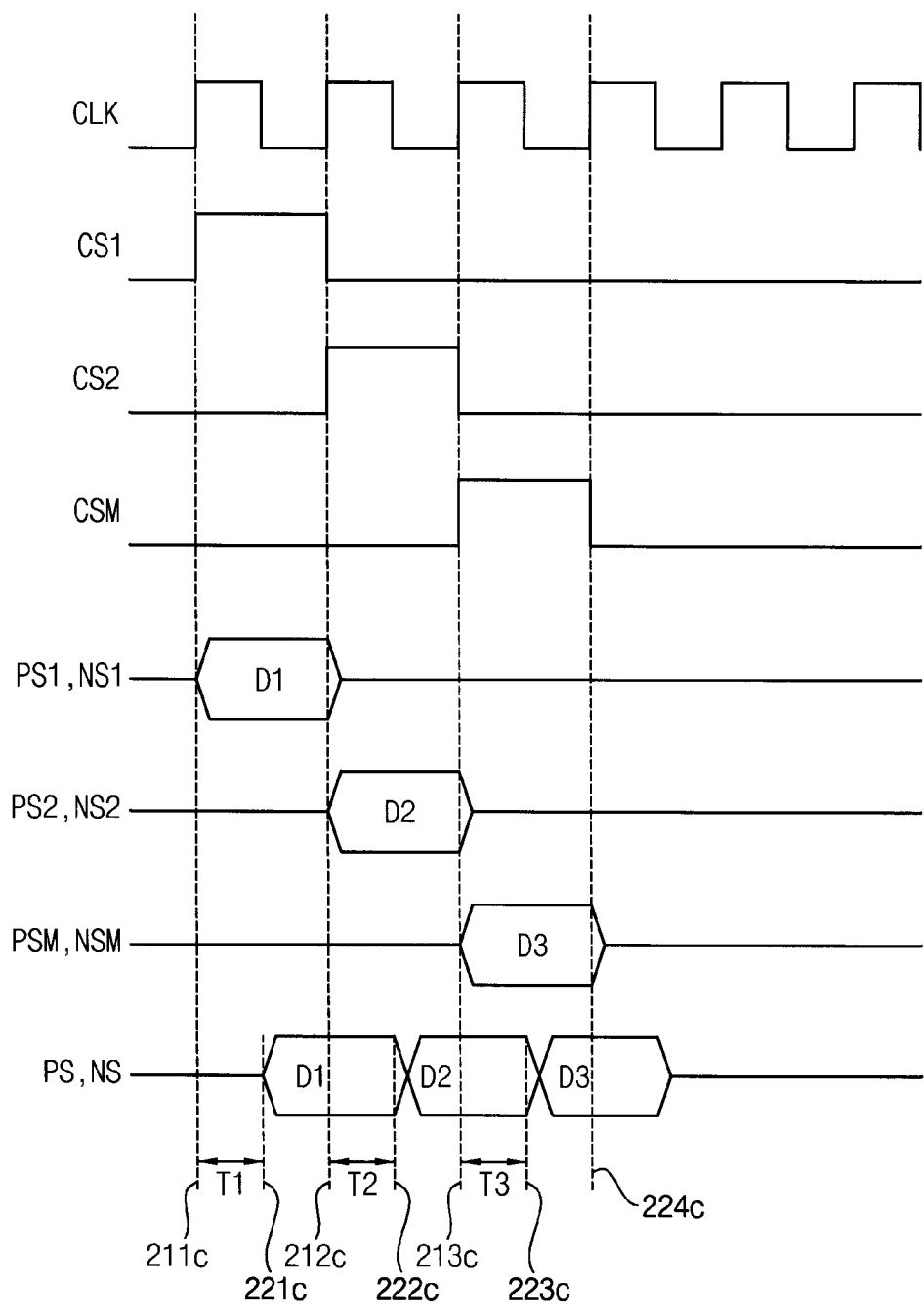

FIGS. 10, 11 and 12 are respective timing diagrams illustrating operation of the data transmission circuit shown in FIG. 1.

FIG. 10 is a timing diagram illustrating operation of the data transmission circuit 100 of FIG. 1 when the relative strengths of the positive data signals PS1, PS2, PSM and the negative data signals NS1, NS2, NSM generated by the data signal driving units DDU1, DDU2, DDUM are not controlled in accordance with a corresponding data transmission distance.

As shown in FIG. 10, the first data driving control signal CS1, second data driving control signal CS2, through (M)-th data driving control signal CSM are sequentially enabled in arranged order.

That is, at a first time point 211a, the first data driving control signal CS1 is enabled, the first data signal driving unit DDU1 generates the first positive data signal PS1 and the first negative data signal NS1 representing a value of D1, and the first data signal driving unit DDU1 provides the first positive data signal PS1 and the first negative data signal NS1 to the positive data transmission line 113 and the negative data transmission line 115, respectively. The first positive data signal PS1 and the first negative data signal NS1 representing the value of D1 are transferred to the data output unit DOU 111 as a positive data input signal PS and a negative data input signal NS through a portion of the positive data transmission line 113 and a portion of the negative data transmission line 115 located between the first data signal driving unit DDU1 and the data output unit DOU 111 at a second time point 221a which is a first propagation delay time T1 after the first time point 211a.

The first propagation delay time T1 may be an RC delay time generated by parasitic resistance and capacitance associated with the positive data transmission line 113 and negative data transmission line 115.

At a third time point 212a, the second data driving control signal CS2 is enabled, the second data signal driving unit DDU2 generates the second positive data signal PS2 and the second negative data signal NS2 representing a value of D2, and the second data signal driving unit DDU2 provides the second positive data signal PS2 and the second negative data signal NS2 to the positive data transmission line 113 and the negative data transmission line 115, respectively. The second positive data signal PS2 and the second negative data signal NS2 representing the value of D2 are transferred to the data output unit DOU 111 as a positive data input signal PS and a negative data input signal NS through a portion of the positive data transmission line 113 and a portion of the negative data transmission line 115 located between the second data signal driving unit DDU2 and the data output unit DOU 111 at a fourth time point 222a which is a second propagation delay time T2 after the third time point 212a.

At a fifth time point 213a, the (M)-th data driving control signal CSM is enabled, the (M)-th data signal driving unit DDUM generates the (M)-th positive data signal PSM and the (M)-th negative data signal NSM representing a value of D3, and the (M)-th data signal driving unit DDUM provides the (M)-th positive data signal PSM and the (M)-th negative data signal NSM to the positive data transmission line 113 and the negative data transmission line 115, respectively. The (M)-th positive data signal PSM and the (M)-th negative data signal NSM representing the value of D3 are transferred to the data output unit DOU 111 as a positive data input signal PS and a negative data input signal NS through a portion of the positive data transmission line 113 and a portion of the negative data transmission line 115 located between the (M)-th data signal driving unit DDUM and the data output unit DOU 111 at a sixth time point 223a which is a third propagation delay time T3 after the fifth time point 213a.

Because a corresponding data transmission distance between the first data signal driving unit DDU1 and the data output unit DOU 111 is greater than a data transmission distance between the second data signal driving unit DDU2 and the data output unit DOU 111, the first propagation delay time T1 will be greater than the second propagation delay time T2. And because the data transmission distance between the second data signal driving unit DDU2 and the data output unit DOU 111 is greater than the data transmission distance between the (M)-th data signal driving unit DDUM and the data output unit DOU 111, the second propagation delay time T2 will be greater than the third propagation delay time T3.

In certain embodiments, the data output unit DOU 111 will generate the recovered data signal RDS by sampling the positive data input signal PS and the negative data input signal NS during a first time period extending from the second time point 221a to the fourth time point 222a when the positive data input signal PS and the negative data input signal NS represent the value of D1. Similarly, the data output unit DOU 111 will generate the recovered data signal RDS by sampling the positive data input signal PS and the negative data input signal NS during a second time period TMIN extending from the fourth time point 222a to the sixth time point 223a when the positive data input signal PS and the negative data input signal NS represent the value of D2. It follows that the data output unit DOU 111 will generate the recovered data signal RDS by sampling the positive data input signal PS and the negative data input signal NS during a third time period extending from the sixth time point 223a to the seventh time point 224a when the positive data input signal PS and the negative data input signal NS represent the value of D3.

As a result, the data output unit DOU 111 will perform sampling during the second time period TMIN which is shorter than the first time period, and during the third time period which is shorter than the second time period TMIN.

FIG. 11 is another timing diagram illustrating operation of the data transmission circuit 100 of FIG. 1 when the relative strengths of the positive data signals PS1, PS2, PSM and the negative data signals NS1, NS2, NSM generated by the data signal driving units DDU1, DDU2, DDUM are controlled according to a corresponding data transmission distance.

A first propagation delay time T1 between a first time point 211b and a second time point 221b, a second propagation delay time T2 between a third time point 212b and a fourth time point 222b, and a third propagation delay time T3 between a fifth time point 213b and a sixth time point 223b may be understood from the foregoing description of FIG. 10.

However, the relative strengths of the first positive data signal PS1 and the first negative data signal NS1 generated by the first data signal driving unit DDU1 and strength of the second positive data signal PS2 and the second negative data signal NS2 generated by the second data signal driving unit DDU2 may be controlled such that the first propagation delay time T1 is equal to the third propagation delay time T3 of FIG. 10 and the second propagation delay time T2 is equal to the third propagation delay time T3 of FIG. 10.

Here, a first time period is from the second time point 221b to the fourth time point 222b when the positive data input signal PS and the negative data input signal NS represent the value of D1. A second time period is from the fourth time point 222b to the sixth time point 223b when the positive data input signal PS and the negative data input signal NS represent the value of D2, and a third time period is from the sixth time point 223b to the seventh time point 224b when the positive data input signal PS and the negative data input signal NS represent the value of D3. Because the first time period, the second time period, and the third time period are the same, the data output unit DOU 111 should perform regular sampling according to a defined period for the clock signal CLK.

From the foregoing it may be understood that the data transmission circuit 100 of FIG. 1 may be used to generate positive data signals PS1, PS2, and PSM and negative data signals NS1, NS2, and NSM having relative signal strengths controlled in accordance with a corresponding propagation delay times T1, T2, and T3 associated with data signal driving units DDU1, DDU2, through DDUM.

FIG. 12 is still another timing diagram illustrating operation of the data transmission circuit 100 of FIG. 1 when the relative strengths of the positive data signals PS1, PS2, PSM and negative data signals NS1, NS2, NSM generated by the data signal driving units DDU1, DDU2, DDUM are controlled based on the data transmission distance.

As before, a first propagation delay time T1 between a first time point 211c and a second time point 221c, a second propagation delay time T2 between a third time point 212c and a fourth time point 222c, and a third propagation delay time T3 between a fifth time point 213c and a sixth time point 223c may be understood from the description of FIG. 10.

The strength of the second positive data signal PS2 and the second negative data signal NS2 generated by the second data signal driving unit DDU2 and strength of the third positive data signal PS3 and the third negative data signal NS3 generated by the third data signal driving unit DDU3 may be controlled so that the second propagation delay time T2 is equal to the first propagation delay time T1 of FIG. 10 and the third propagation delay time T3 is equal to the first propagation delay time T1 of FIG. 10.

A first time period is from the second time point 221c to the fourth time point 222c, when the positive data input signal PS and the negative data input signal NS represent the value of D1. A second time period is from the fourth time point 222c to the sixth time point 223c, when the positive data input signal PS and the negative data input signal NS represent the value of D2. A third time period is from the sixth time point 223c to the seventh time point 224c, when the positive data input signal PS and the negative data input signal NS represent the value of D3. Because the first time period, the second time period, and the third time period are the same, the data output unit DOU 111 should perform sampling within a period of clock signal CLK.

Thus, the data transmission circuit 100 of FIG. 1 may be used to control the relative strengths of the positive data signals PS1, PS2, and PSM and negative data signals NS1, NS2, and NSM in relation to propagation delay times T1, T2, and T3 for the data signal driving units DDU1, DDU2, and DDUM.

Figure 13:
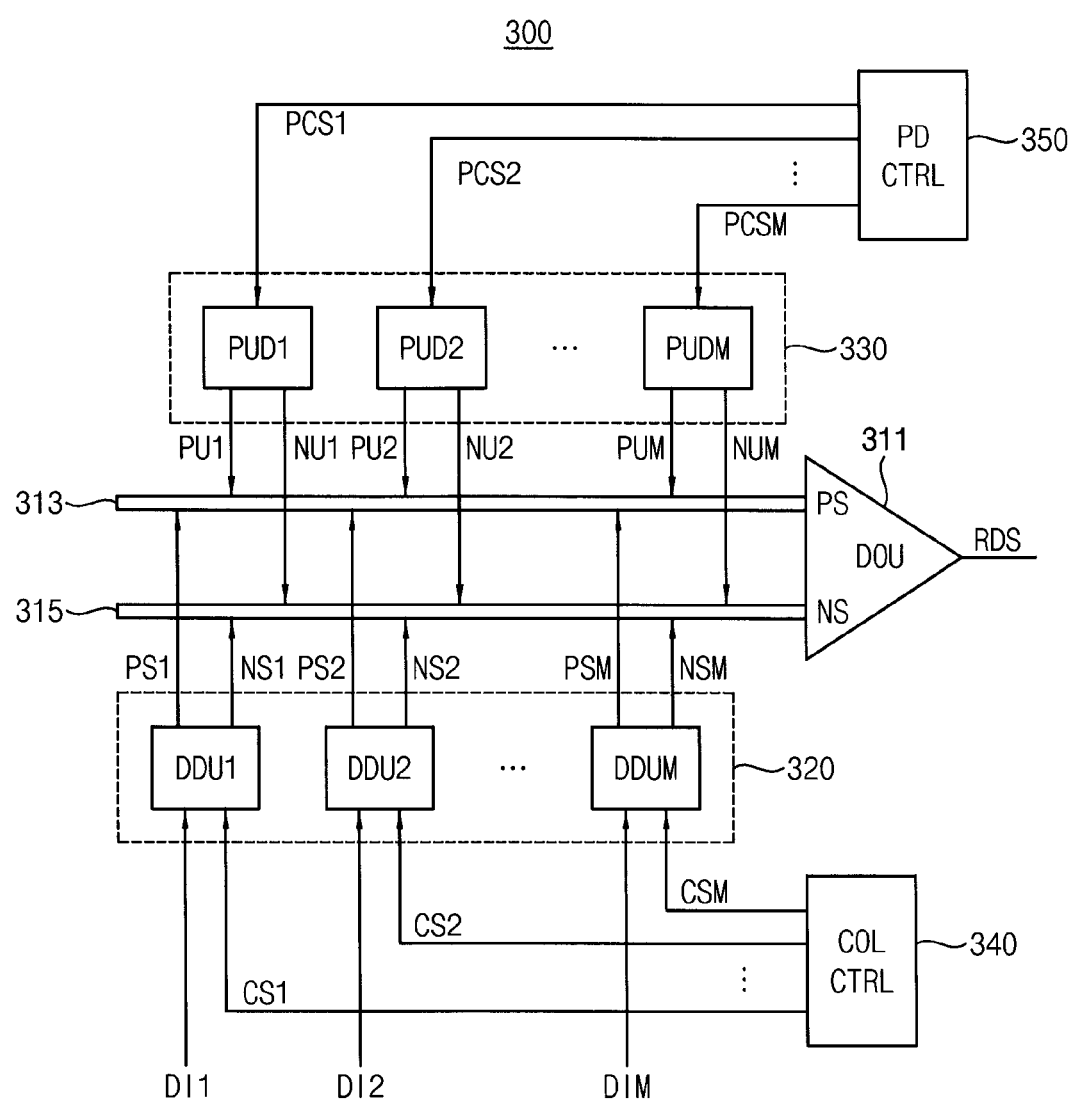
FIG. 13 is a block diagram illustrating in another example a data transmission circuit according to an embodiment of the inventive concept.

FIG. 13 is a block diagram illustrating a data transmission circuit according to another embodiment of the inventive concept.

Referring to FIG. 13, a data transmission circuit 300 comprises a positive data transmission line 313, a negative data transmission line 315, a data output unit DOU 311, a data signal driving circuit 320, and a pull-up circuit 330. The data output unit DOU 311 may be used to generate a recovered data signal RDS based on signals communicated via the positive data transmission line 313 and negative data transmission line 315. The data signal driving circuit 320 comprises a plurality of data signal driving units DDU1, DDU2, through DDUM, wherein the data signal driving units DDU1, DDU2 through DDUM are respectively connected at different points along the positive data transmission line 313 and negative data transmission line 315. The pull-up circuit 330 comprises a plurality of pull-up devices PUD1, PUD2, and PUDM, wherein the pull-up devices PUD1, PUD2, and PUDM are also respectively connected along the different points along the positive data transmission line 313 and negative data transmission line 315. That is, the location of the pull-up devices PUD1, PUD2, and PUDM correspond to the respective locations of the data signal driving units DDU1, DDU2, and DDUM.

Accordingly, the first pull-up device PUD 1 corresponds to the first data signal driving unit DDU1. The first pull-up device PUD1 generates a first positive pull-up signal PU1 and a first negative pull-up signal NU1 based on a data transmission distance from the first data signal driving unit DDU1 to the data output unit DOU 311. The first pull-up device PUD1 provides the first positive pull-up signal PU1 and the first negative pull-up signal NU1 to the positive data transmission line 313 and the negative data transmission line 315, respectively.

The second pull-up device PUD2 corresponds to the second data signal driving unit DDU2. The second pull-up device PUD2 generates a second positive pull-up signal PU2 and a second negative pull-up signal NU2 based on a data transmission distance from the second data signal driving unit DDU2 to the data output unit DOU 311. The second pull-up device PUD2 provides the second positive pull-up signal PU2 and the second negative pull-up signal NU2 to the positive data transmission line 313 and the negative data transmission line 315, respectively.

The (M)-th pull-up device PUDM corresponds to the (M)-th data signal driving unit DDUM. The (M)-th pull-up device PUDM generates an (M)-th positive pull-up signal PUM and an (M)-th negative pull-up signal NUM based on a data transmission distance from the (M)-th data signal driving unit DDUM to the data output unit DOU 311. The (M)-th pull-up device PUDM provides the (M)-th positive pull-up signal PUM and the (M)-th negative pull-up signal NUM to the positive data transmission line 313 and the negative data transmission line 315, respectively.

The pull-up devices PUD1, PUD2, and PDUM may be used to generate the positive pull-up signals PU1, PU2, and PUM and the negative pull-up signals NU1, NU2, and NUM based on pull-up device control signals PCS1, PCS2, and PCSM generated in a pull-up device controller PD CTRL. The positive pull-up signals PU1, PU2, and PUM may maintain a direct current (DC) bias voltage on the positive data transmission line 313. The negative pull-up signals NU1, NU2, and NUM may maintain a DC bias voltage of the negative data transmission line 315.

The first data signal driving unit DDU1 may generate a first positive data signal PS1 and a first negative data signal NS1 based on a first data input signal DI1 and a data transmission distance from the first data signal driving unit DDU1 to the data output unit DOU 311. The first data signal driving unit DDU1 may provide the first positive data signal PS1 and the first negative data signal NS1 to the positive data transmission line 313 and the negative data transmission line 315, respectively. The second data signal driving unit DDU2 may generate a second positive data signal PS2 and a second negative data signal NS2 based on a second data input signal DI2 and a data transmission distance from the second data signal driving unit DDU2 to the data output unit DOU 311. The second data signal driving unit DDU2 may provide the second positive data signal PS2 and the second negative data signal NS2 to the positive data transmission line 313 and the negative data transmission line 315, respectively. The (M)-th data signal driving unit DDUM may generate an (M)-th positive data signal PSM and an (M)-th negative data signal NSM based on an (M)-th data input signal DIM and a data transmission distance from the (M)-th data signal driving unit DDUM to the data output unit DOU 311. The (M)-th data signal driving unit DDUM may provide the (M)-th positive data signal PSM and the (M)-th negative data signal NSM to the positive data transmission line 313 and the negative data transmission line 315, respectively. The data signal driving units DDU1, DDU2, and DDUM may be understood from the foregoing description with reference to FIGS. 1, 2, 3, 4, 5, 6, 7, 8, 9, 10, 11, and 12.

The data signal driving units DDU1, DDU2, and DDUM may operate sequentially based on data driving control signals CS1, CS2, and CSM generated in a data driving controller COL CTRL 340. The pull-up devices PUD1, PUD2, and PUDM may not be included in the data output unit DOU 311. The pull-up devices PUD1, PUD2, and PUDM may be spatially separated from the data output unit DOU 311.

Figure 14:
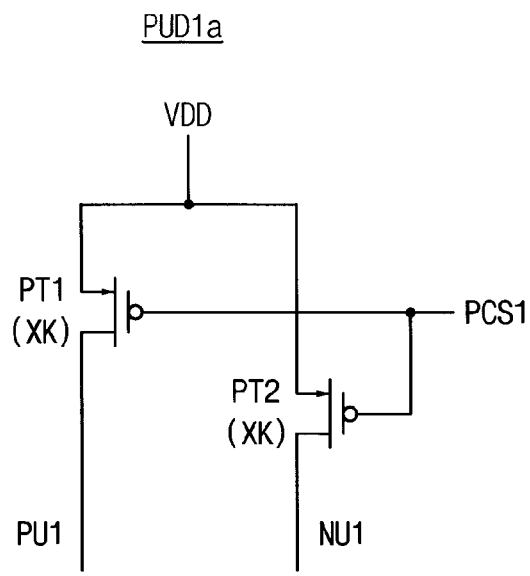
FIGS. 14 and 15 are circuit diagrams further illustrating in different examples the first pull-up device of FIG. 13.
Figure 15:
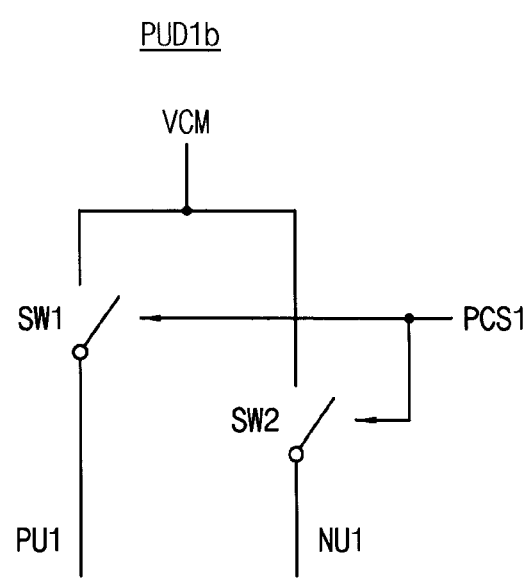

FIGS. 14 and 15 are respective circuit diagrams illustrating possible embodiments of the first pull-up device included in the data transmission circuit of FIG. 13. Each of the second pull-up device PUD2 through (M)-th pull-up device PUDM is assumed to have the same configuration as the first pull-up device PUD1.

Referring to FIG. 14, a first pull-up device PUD1a comprises a first pull-up transistor PT1 and a second pull-up transistor PT2. The supply voltage VDD is provided to the drain terminal of the first pull-up transistor PT1. The first pull-up device control signal PCS1 is provided to the gate terminal of the first pull-up transistor PT1. The source terminal of the first pull-up transistor PT1 outputs the first positive pull-up signal PU1. The supply voltage VDD is provided to the drain terminal of the second pull-up transistor PT2. The first pull-up device control signal PCS1 is provided to the gate terminal of the second pull-up transistor PT2. The source terminal of the second pull-up transistor PT2 outputs the first negative pull-up signal NU1.

The first pull-up device control signal PCS1 may be voltage signal provided to the gate terminals of the pull-up transistors PT1, PT2 included in the first pull-up device PUD1a.

The strength of the first positive pull-up signal PU1 and the first negative pull-up signal NU1 may be controlled by "sizing" the pull-up transistors PT1, PT2 included in the first pull-up device PUD1a. The pull-up transistors PT1, PT2 may be PMOS transistors, wherein the size of each PMOS transistor may be expressed as a ratio between its channel width (W) and channel length (L).

The size(s) of the first pull-up transistor PT1 and second pull-up transistor PT2 may be K times greater than the size of a unit pull-up transistor. Thus, the strength of the first positive pull-up signal PU1 and first negative pull-up signal NU1 generated by the first pull-up device PUD1a including the pull-up transistors PT1, PT2 which have K times greater sizes than the unit pull-up transistor may be K times higher than a strength of the first positive pull-up signal PU1 and the first negative pull-up signal NU1 generated by the first pull-up device PUD1a including the pull-up transistors PT1, PT2 which have the same sizes as the unit pull-up transistor.

The strength of the first positive pull-up signal PU1 and the first negative pull-up signal NU1 may be controlled by a voltage level of the first pull-up device control signal PCS1 which is a voltage signal provided to the gate terminals of the pull-up transistors PT1, PT2 included in the first pull-up device PUD1a. When the first pull-up transistor PT1 and the second pull-up transistor PT2 operate outside a saturation mode and voltage level of the first pull-up device control signal PCS1 increases, the strength of the positive pull-up signal PU1 and strength of the negative pull-up signal NU1 generated by the first pull-up device PUD1a also increase.

Referring to FIG. 15, the first pull-up device PUD1, such as the type included in the data transmission circuit 300 of FIG. 13, may include a first switch SW1 and a second switch SW2. The first switch SW1 may include a first terminal receiving a pull-up voltage VCM and a second terminal that outputs the positive pull-up signal PU1. The second switch SW2 may include a third terminal that receives the pull-up voltage VCM and a fourth terminal that outputs the negative pull-up signal NU1. The first switch SW1 and the second switch SW2 may operate in response to the first pull-up device control signal PCS1.

Figure 16:
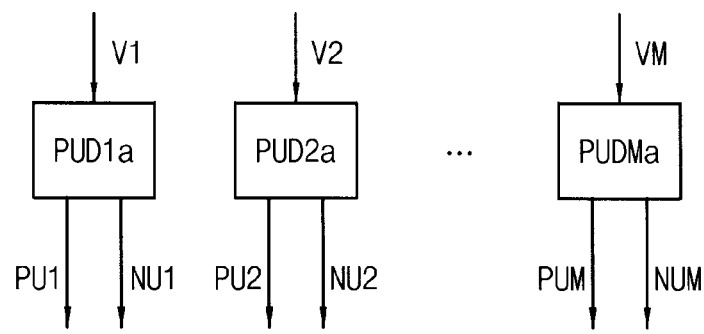
FIGS. 16, 17 and 18 are block diagrams further illustrating in different examples the pull-up circuit of FIG. 13.
Figure 17:
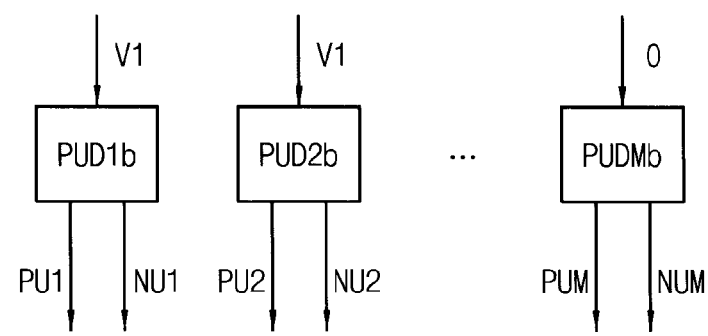
Figure 18:
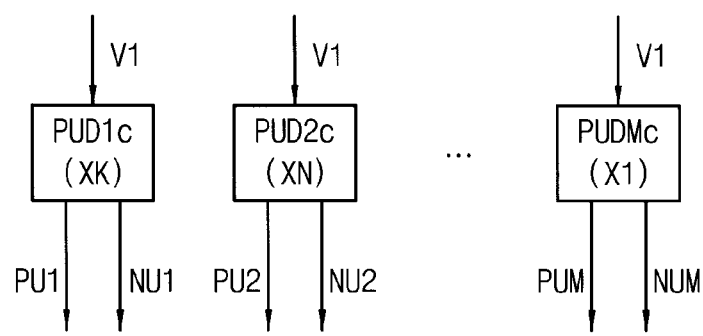

FIGS. 16, 17 and 18 are respective block diagrams illustrating possible embodiments of the pull-up circuit included in the data transmission circuit of FIG. 13.

Referring to FIG. 16, a pull-up circuit 330a includes a first pull-up device PUD1a, a second pull-up device PUD2a, an (M)-th pull-up device PUDMa. Pull-up voltages provided to the pull-up devices PUD1a, PUD2a, and PUDMa may be differently defined. FIG. 16 illustrates an embodiment wherein a pull-up voltage of the first pull-up device PUD1a is a first voltage V1, a pull-up voltage of the second pull-up device PUD2a is a second voltage V2, and a pull-up voltage of the (M)-th pull-up device PUDMa is an (M)-th voltage VM. The size of each of the pull-up devices PUD1a, PUD2a, and PUDMa is assumed to be the same as the size of a minimum pull-up transistor.

The strength of the first positive pull-up signal PU1 and first negative pull-up signal NU1 will be proportional to data transmission distance. That is, since a distance between the first data signal driving unit DDU1 corresponding to the first pull-up device PUD1a to the data output unit DOU 311 is greater than a distance between the second data signal driving unit DDU2 corresponding to the second pull-up device PUD2a to the data output unit DOU 311, the voltage level of the first voltage V1 is higher than the voltage level of the second voltage V2. And since the distance between the second data signal driving unit DDU2 corresponding to the second pull-up device PUD2a to the data output unit DOU 311 is greater than the distance between the (M)-th data signal driving unit DDUM corresponding to the (M)-th pull-up device PUDMa to the data output unit DOU 311, the voltage level of the second voltage V2 is higher than the voltage level of the (M)-th voltage VM.

Because a pull-up speed of the first positive data signal PS1 and the first negative data signal NS1, which are dominantly affected by the first pull-up device PUD1a that is the nearest pull-up device to the first data signal driving unit DDU1, is faster than a pull-up speed of the second positive data signal PS2 and the second negative data signal NS2, which are dominantly affected by the second pull-up device PUD2a that is the nearest pull-up device to the second data signal driving unit DDU2, a difference between a first propagation delay time and a second propagation delay time may be reduced. The first propagation delay time elapses for transferring the first positive data signal PS1 and the first negative data signal NS1, which are generated by the first data signal driving unit DDU1 corresponding to the first pull-up device PUD1a, to the data output unit DOU 311. The second propagation delay time elapses for transferring the second positive data signal PS2 and the second negative data signal NS2, which are generated by the second data signal driving unit DDU2 corresponding to the second pull-up device PUD2a, to the data output unit DOU 311.

Because the pull-up speed of the second positive data signal PS2 and the second negative data signal NS2, which are dominantly affected by the second pull-up device PUD2a that is the nearest pull-up device to the second data signal driving unit DDU2, is faster than a pull-up speed of the (M)-th positive data signal PSM and the (M)-th negative data signal NSM, which are dominantly affected by the (M)-th pull-up device PUDMa that is the nearest pull-up device to the (M)-th data signal driving unit DDUM, a difference between the second propagation delay time and an (M)-th propagation delay time may be reduced. The (M)-th propagation delay time elapses for transferring the (M)-th positive data signal PSM and the (M)-th negative data signal NSM, which are generated by the (M)-th data signal driving unit DDUM corresponding to the (M)-th pull-up device PUDMa, to the data output unit DOU 311.

Referring to FIG. 17, a pull-up circuit 330b comprises a first pull-up device PUD1b and a second pull-up device PUD2b. Each of a voltage level of a voltage signal provided to the gate terminal of a pull-up transistor included in the first pull-up device PUD1b and a voltage level of a voltage signal provided to the gate terminal of a pull-up transistor included in the second pull-up device PUD2b may be the same as the voltage level of the first voltage V1.

When pull-up devices but the first pull-up device PUD1b and the second pull-up device PUD2b have the ground voltage as pull-up voltages, only the first pull-up device PUD1b and the second pull-up device PUD2b may operate. In other words, the pull-up devices PUD1b, PUD2b, and PUDMb may operate in part.

Referring to FIG. 18, a first pull-up device PUD 1c receives the first voltage V1 as the first pull-up device control signal PCS1. Pull-up transistors included in the first pull-up device PUD1c may have K times greater than the size of a minimum pull-up transistor. The second pull-up device PUD2c may receive the first voltage V1 as the second pull-up device control signal PCS2. Pull-up transistors included in the second pull-up device PUD2c may have N times greater than the size of the minimum pull-up transistor. The (M)-th pull-up device PUDMc may receive the first voltage V1 as the (M)-th pull-up device control signal PCSM. Pull-up transistors included in the (M)-th pull-up device PUDMc may have the same size as the minimum pull-up transistor.

Because the distance from the first data signal driving unit DDU1 corresponding to the first pull-up device PUD 1c to the data output unit DOU 311 is greater than the distance from the second data signal driving unit DDU2 corresponding to the second pull-up device PUD2c to the data output unit DOU 311, K being greater than N. Because the distance from the second data signal driving unit DDU2 corresponding to the second pull-up device PUD2c to the data output unit DOU 311 is greater than the distance from the (M)-th data signal driving unit DDUM corresponding to the (M)-th pull-up device PUDMc to the data output unit DOU 311, N is greater than 1.

Because a pull-up speed of the first positive data signal PS1 and the first negative data signal NS1, which are dominantly affected by the first pull-up device PUD 1c that is the nearest pull-up device to the first data signal driving unit DDU1, is greater than a pull-up speed of the second positive data signal PS2 and the second negative data signal NS2, which are dominantly affected by the second pull-up device PUD2c that is the nearest pull-up device to the second data signal driving unit DDU2, a difference between a first propagation delay time and a second propagation delay time may be reduced. The first propagation delay time elapses for transferring the first positive data signal PS1 and the first negative data signal NS1, which are generated by the first data signal driving unit DDU1 corresponding to the first pull-up device PUD1c, to the data output unit DOU 311. The second propagation delay time elapses for transferring the second positive data signal PS2 and the second negative data signal NS2, which are generated by the second data signal driving unit DDU2 corresponding to the second pull-up device PUD2c, to the data output unit DOU 311.

Because the pull-up speed of the second positive data signal PS2 and the second negative data signal NS2, which are dominantly affected by the second pull-up device PUD2c that is the nearest pull-up device to the second data signal driving unit DDU2, is faster than a pull-up speed of the (M)-th positive data signal PSM and the (M)-th negative data signal NSM, which are dominantly affected by the (M)-th pull-up device PUDMc that is the nearest pull-up device to the (M)-th data signal driving unit DDUM, a difference between the second propagation delay time and an (M)-th propagation delay time may be reduced. The (M)-th propagation delay time elapses for transferring the (M)-th positive data signal PSM and the (M)-th negative data signal NSM, which are generated by the (M)-th data signal driving unit DDUM corresponding to the (M)-th pull-up device PUDMc, to the data output unit DOU 311.

Figure 19:
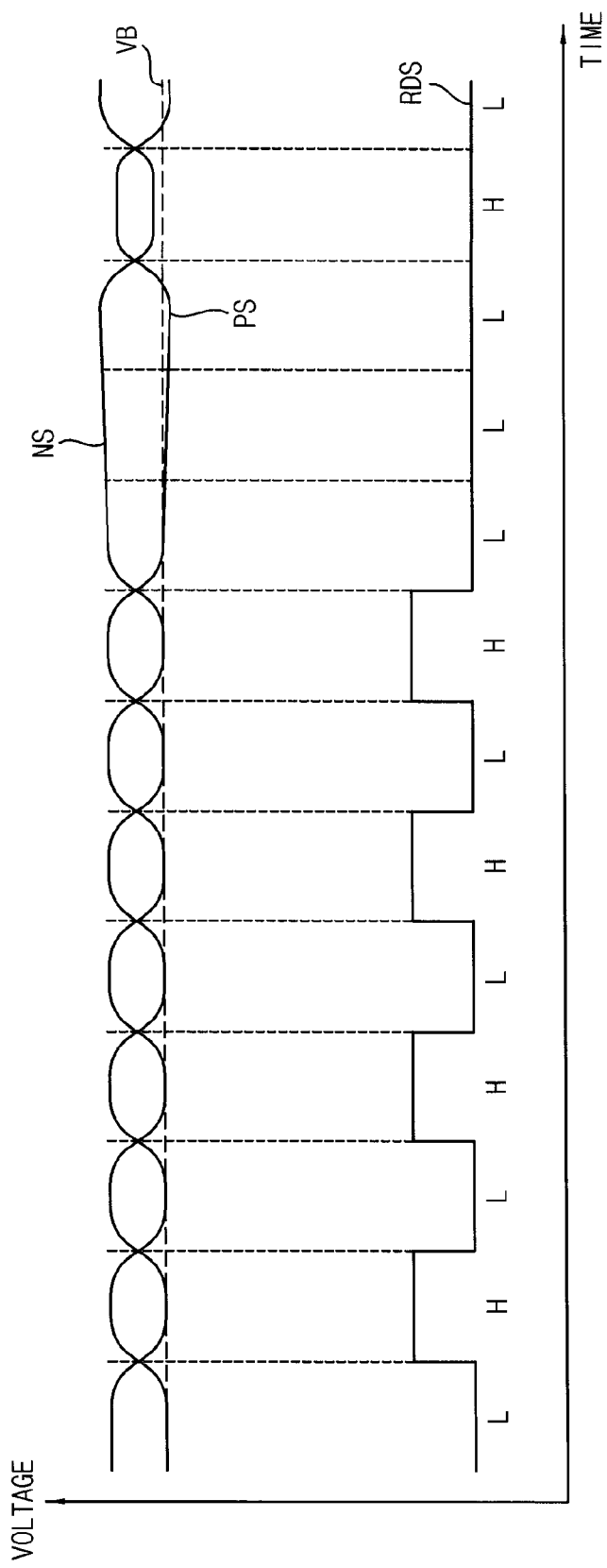
FIG. 19 is a timing diagram illustrating exemplary operation of the data transmission circuit of FIG. 13.

FIG. 19 is a timing diagram illustrating operation of the data transmission circuit of FIG. 13.

Referring to FIG. 19, the pull-up devices PUD1, PUD2, and PUDM maintain a lower boundary voltage of the positive data input signal PS of the data output unit 311 as DC bias voltage VB. The pull-up devices PUD1, PUD2, and PUDM maintain a lower boundary voltage of the negative data input signal NS of the data output unit 311 as DC bias voltage VB.

The data output unit DOU 311 generates the recovered data signal RDS based on the positive data input signal PS and the negative data input signal NS.

FIGS. 20 through 27 are respective block diagrams illustrating image sensors according to certain embodiments of the inventive concept.

Figure 20:
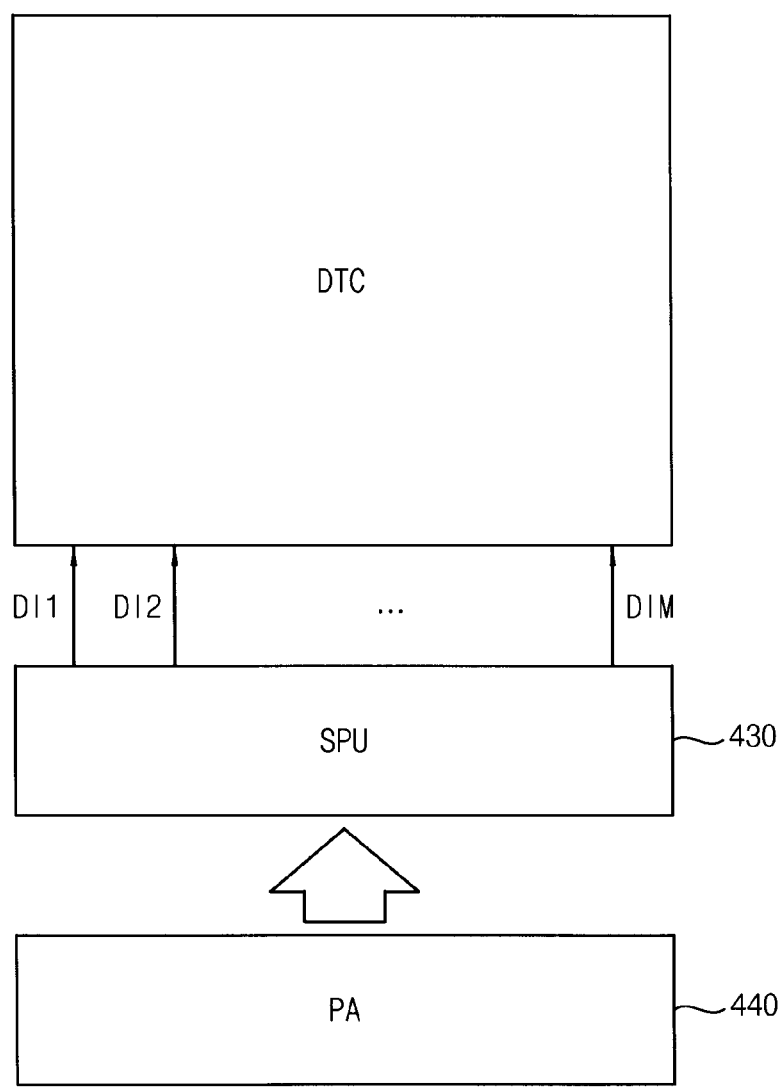
FIGS. 20 through 27 are block diagrams illustrating certain image sensors that may incorporate a data transmission circuit according to various embodiments of the inventive concept.

Referring to FIG. 20, an image sensor 400 includes a pixel array PA 440, a signal processing unit SPU 430, and a data transmission circuit DTC.

The pixel array PA 440 generates analog signals indicative of a captured image. The signal processing unit SPU 430 converts these analog signals into corresponding digital signals DI1, DI2, and DIM. The data transmission circuit then outputs the digital signals DI1, DI2, and DIM from the image sensor 400.

Figure 21:
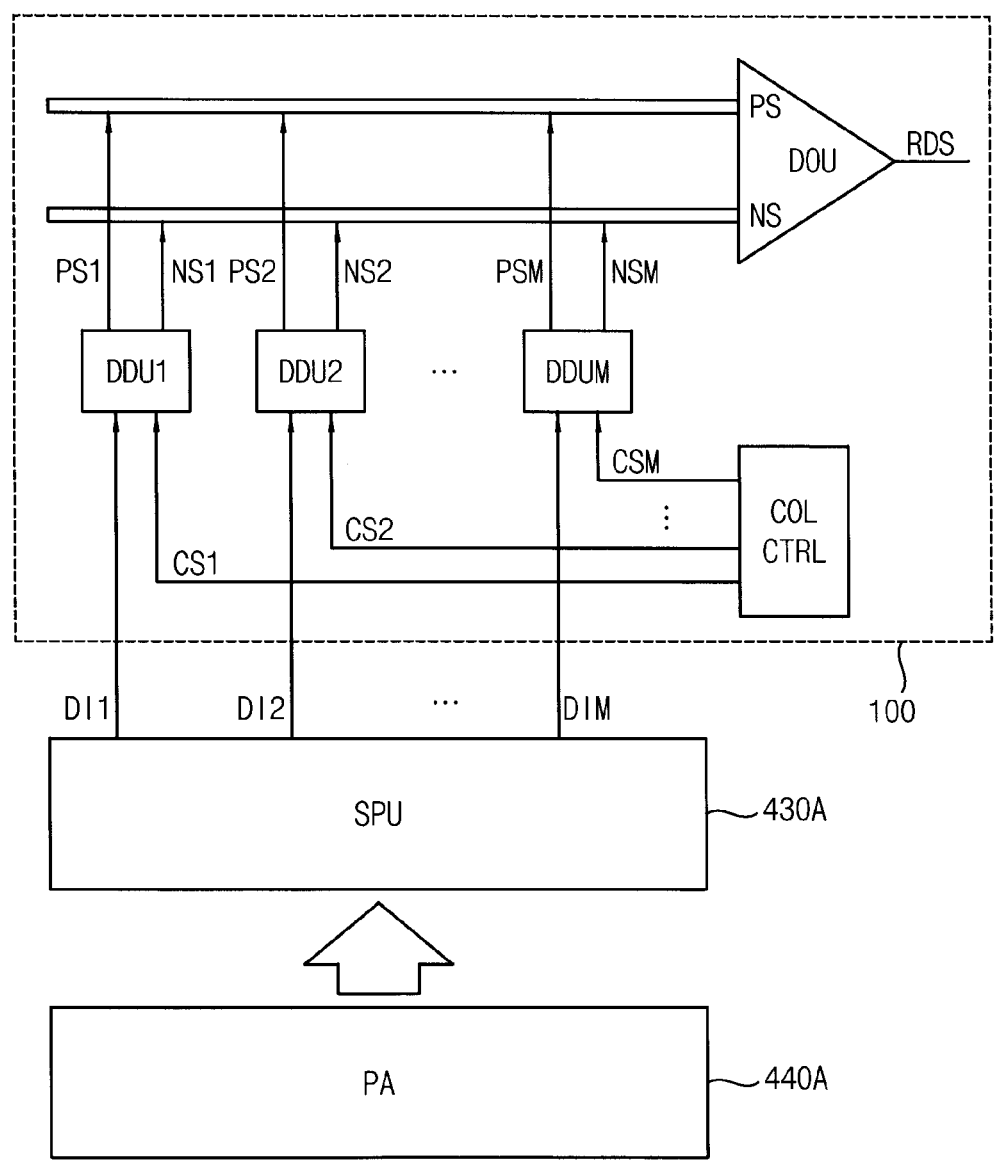

FIG. 21 illustrates an embodiment of the inventive concept in which the data transmission circuit 100 of FIG. 1 is used as the data transmission circuit 400 of FIG. 20.

Here, an image sensor 400A comprises the pixel array PA 440A and the signal processing unit SPU 430A as well as a positive data transmission line, a negative data transmission line, a data output unit DOU, and a plurality of data signal driving units DDU1, DDU2, and DDUM. The pixel array PA 440A generates analog signals and the signal processing unit SPU 430A converts the analog signals into corresponding digital signals DI1, DI2, and DIM. The data output unit DOU generates a recovered data signal RDS based on the signals communicated via the positive data transmission line and negative data transmission line, wherein the data signal driving units DDU1, DDU2, through DDUM are connected at different points along the positive data transmission line and negative data transmission line, respectively. The first data signal driving unit DDU1 generates a first positive data signal PS1 and a first negative data signal NS1 based on the first digital signal DI1 and a data transmission distance from the first data signal driving unit DDU1 to the data output unit DOU. The first data signal driving unit DDU1 provides the first positive data signal PS1 and the first negative data signal NS1 to the positive data transmission line and the negative data transmission line, respectively. The second data signal driving unit DDU2 generates a second positive data signal PS2 and a second negative data signal NS2 based on the second digital signal DI2 and a data transmission distance from the second data signal driving unit DDU2 to the data output unit DOU. The second data signal driving unit DDU2 provides the second positive data signal PS2 and the second negative data signal NS2 to the positive data transmission line and the negative data transmission line respectively. The (M)-th data signal driving unit DDUM generates an (M)-th positive data signal PSM and an (M)-th negative data signal NSM based on the (M)-th digital signal DIM and a data transmission distance from the (M)-th data signal driving unit DDUM to the data output unit DOU. The (M)-th data signal driving unit DDUM provides the (M)-th positive data signal PSM and the (M)-th negative data signal NSM to the positive data transmission line and the negative data transmission line, respectively. A data driving controller COLCTRL may be used to generate the data driving control signals CS1, CS2, through CSM.

Figure 22:
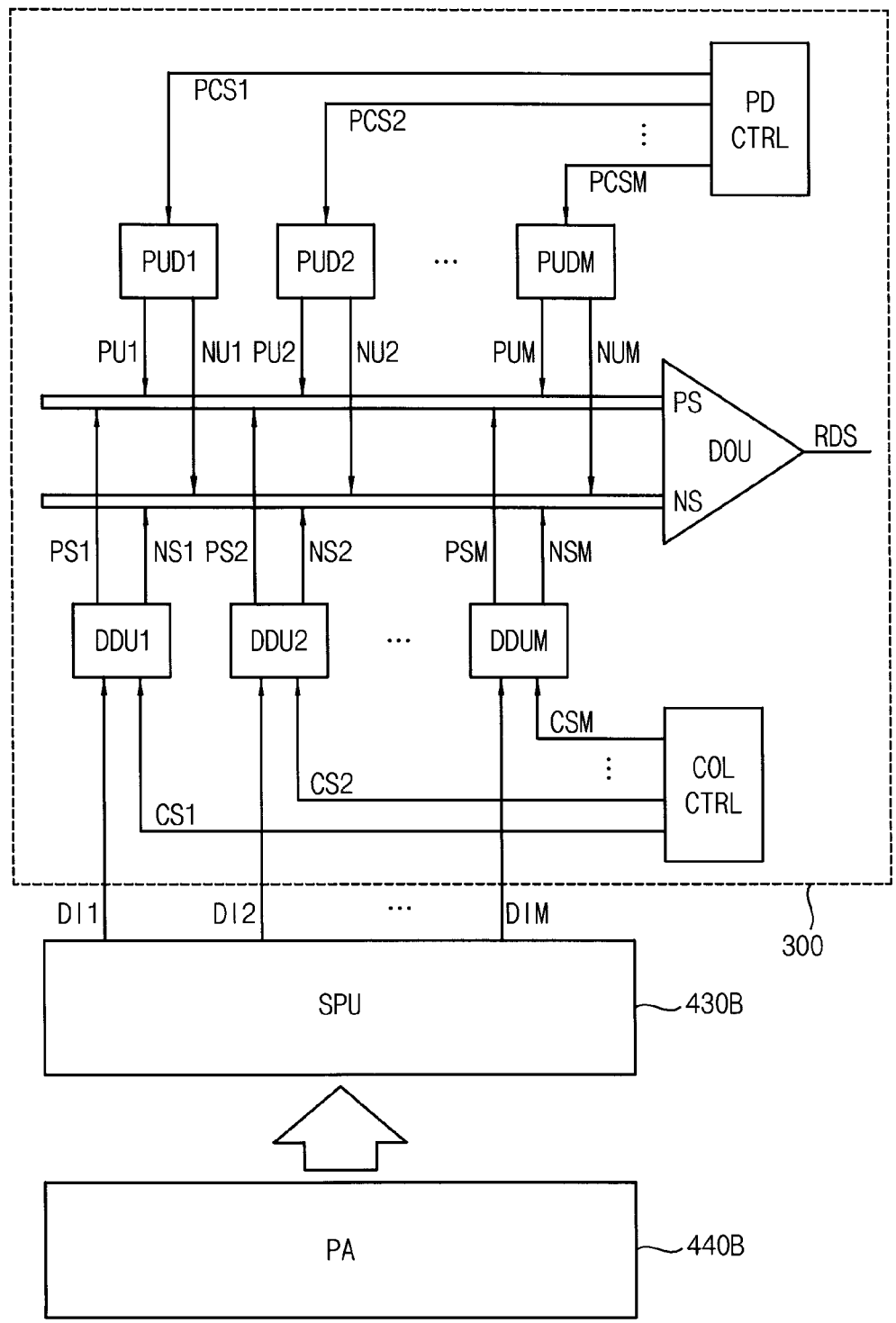

FIG. 22 illustrates an embodiment of the inventive concept in which the data transmission circuit 300 of FIG. 13 is used as the data transmission circuit 400 of FIG. 20.

Here, an image sensor 400B comprises the pixel array PA 440B and signal processing unit SPU 430B as well as a positive data transmission line, a negative data transmission line, a data output unit DOU, a plurality of data signal driving units DDU1, DDU2, and DDUM, and a plurality of pull-up devices PUD1, PUD2, and PUDM. The pixel array PA 440B generates analog signals representing a captured image, and the signal processing unit SPU 430B converts the analog signals into corresponding digital signals DI1, DI2, and DIM. The data output unit DOU generates a recovered data signal RDS based on signals transferred through the positive data transmission line and the negative data transmission line, wherein the data signal driving units DDU1, DDU2, and DDUM are connected at different points along the positive data transmission line and negative data transmission line, respectively. The first data signal driving unit DDU1 generates a first positive data signal PS1 and a first negative data signal NS1 based on the first digital signal DI1 and a data transmission distance from the first data signal driving unit DDU1 to the data output unit DOU. The first data signal driving unit DDU1 provides the first positive data signal PS1 and the first negative data signal NS1 to the positive data transmission line and the negative data transmission line, respectively. The second data signal driving unit DDU2 generates a second positive data signal PS2 and a second negative data signal NS2 based on the second digital signal DI2 and a data transmission distance from the second data signal driving unit DDU2 to the data output unit DOU. The second data signal driving unit DDU2 provides the second positive data signal PS2 and the second negative data signal NS2 to the positive data transmission line and the negative data transmission line respectively. The (M)-th data signal driving unit DDUM generates an (M)-th positive data signal PSM and an (M)-th negative data signal NSM based on the (M)-th digital signal DIM and a data transmission distance from the (M)-th data signal driving unit DDUM to the data output unit DOU. The (M)-th data signal driving unit DDUM provides the (M)-th positive data signal PSM and the (M)-th negative data signal NSM to the positive data transmission line and the negative data transmission line respectively. A data driving controller COL CTRL may be used to generate the data driving control signals CS1, CS2, and CSM. The pull-up devices PUD1, PUD2, and PUDM are connected to different portions of the positive data transmission line and the negative data transmission line respectively. The pull-up devices PUD1, PUD2, and PUDM correspond to the data signal driving units DDU1, DDU2, and DDUM, respectively.

The first pull-up device PUD1 corresponds to the first data signal driving unit DDU1. The first pull-up device PUD1 generates a first positive pull-up signal PU1 and a first negative pull-up signal NU1 based on the data transmission distance from the first data signal driving unit DDU1 to the data output unit DOU. The first pull-up device PUD1 provides the first positive pull-up signal PU1 and the first negative pull-up signal NU1 to the positive data transmission line and the negative data transmission line, respectively. The second pull-up device PUD2 corresponds to the second data signal driving unit DDU2. The second pull-up device PUD2 generates a second positive pull-up signal PU2 and a second negative pull-up signal NU2 based on the data transmission distance from the second data signal driving unit DDU2 to the data output unit DOU. The second pull-up device PUD2 provides the second positive pull-up signal PU2 and the second negative pull-up signal NU2 to the positive data transmission line and the negative data transmission line respectively. The (M)-th pull-up device PUDM corresponds to the (M)-th data signal driving unit DDUM. The (M)-th pull-up device PUDM generates an (M)-th positive pull-up signal PUM and an (M)-th negative pull-up signal NUM based on the data transmission distance from the (M)-th data signal driving unit DDUM to the data output unit DOU. The (M)-th pull-up device PUDM provides the (M)-th positive pull-up signal PUM and the (M)-th negative pull-up signal NUM to the positive data transmission line and the negative data transmission line, respectively.

Figure 23:
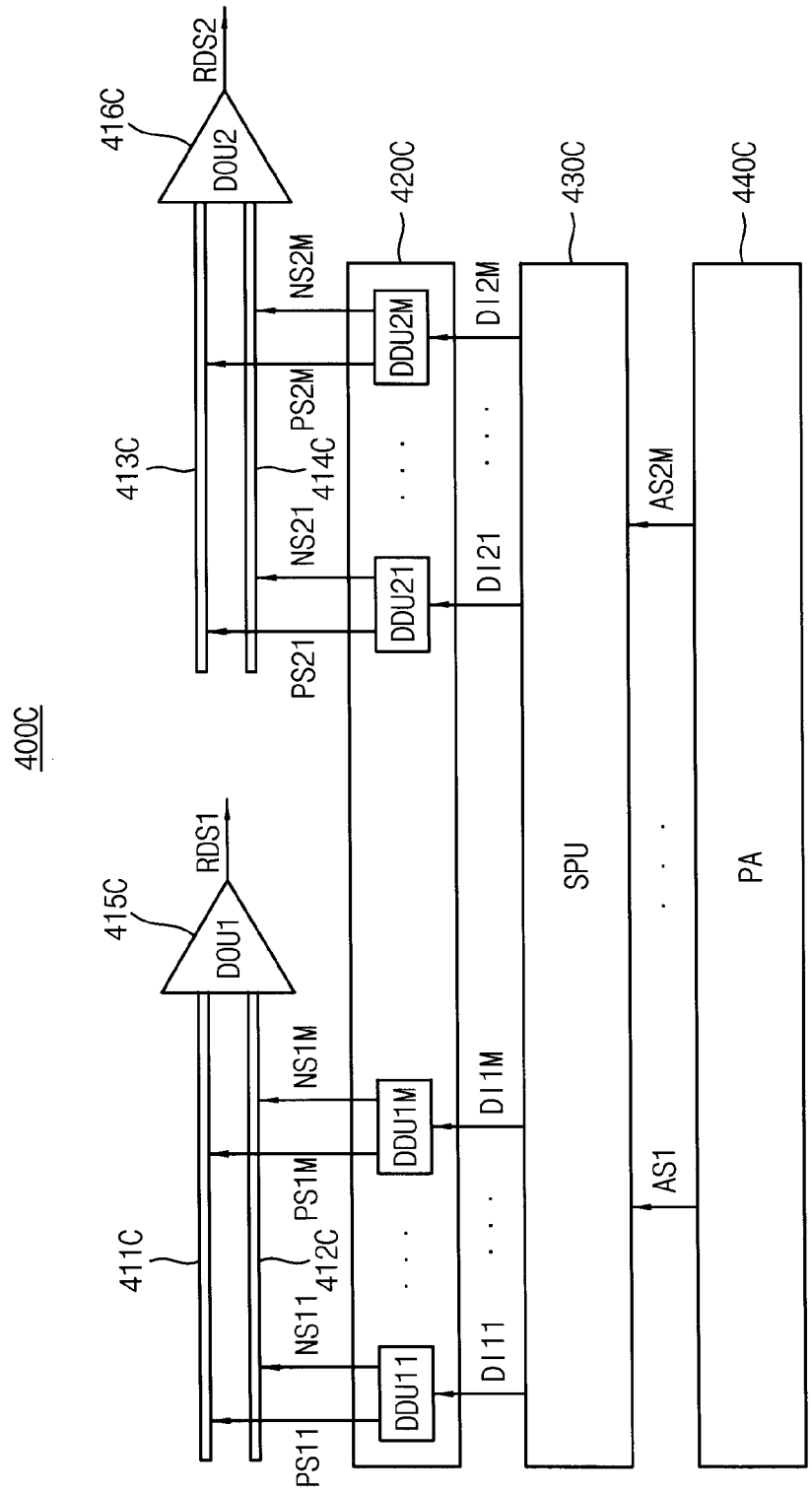

Referring to FIG. 23, an image sensor 400C includes a pixel array PA 440C, a signal processor SPU 430C, a first positive data transmission line 411C, a first negative data transmission line 412C, a second positive data transmission line 413C, a second negative data transmission line 414C, a first data output unit 415C, a second data output unit 416C, and a data signal driving circuit 420C. The data signal driving circuit 420C includes first through (M)-th data signal driving units DDU11 through DDU1M and (M+1)-th through (2M)-th data signal driving units DDU21 through DDU2M. In an example embodiment, the image sensor 400C may further include a positive data transmission line, a negative data transmission line, and a data output unit and the data signal driving circuit 420C may further include a data signal driving unit.

The pixel array 440C generates analog signals AS1 through AS2M representing a captured image. The signal processor 430C converts the analog signals AS1 through AS2M to first and second digital signals DI11 through DI1M, DI21 through DI2M. The first data output unit 415C is connected to the first positive data transmission line 411C and first negative data transmission line 412C and generates a first recovered data signal RDS1 based on data signals communicated via the first positive data transmission line 411C and first negative data transmission line 412C. The second data output unit 416C is connected to the second positive data transmission line 413C and second negative data transmission line 414C and generates a second recovered data signal RDS2 based on data signals communicated via the second positive data transmission line 413C and second negative data transmission line 414C.

The first through (M)-th data signal driving units DDU11 through DDU1M are respectively connected at different points along the first positive data transmission line 411C and first negative data transmission line 412C. The first data signal driving unit DDU11 generates a first positive data signal PS11 and a first negative data signal NS11 based on the first digital signal DI11 and a data transmission distance between the first data signal driving unit DDU11 and the first data output unit 415C, and provides the first positive data signal PS11 to the first positive data transmission line 411C and the first negative data signal NS11 to the first negative data transmission line 412C. The (M)-th data signal driving unit DDU1M generates a (M)-th positive data signal PS1M and a (M)-th negative data signal NS1M based on the (M)-th digital signal DI1M and a data transmission distance between the (M)-th data signal driving unit DDU1M and the first data output unit 415C, and provides the (M)-th positive data signal PS1M to the first positive data transmission line 411C and the (M)-th negative data signal NS1M to the first negative data transmission line 412C.

The (M+1)-th through (2M)-th data signal driving units DDU21 through DDU2M are respectively connected at different points along the second positive data transmission line 413C and second negative data transmission line 414C. The (M+1)-th data signal driving unit DDU21 generates a (M+1)-th positive data signal PS21 and a (M+1)-th negative data signal NS21 based on the (M+1)-th digital signal DI21 and a data transmission distance between the (M+1)-th data signal driving unit DDU21 and the second data output unit 416C, and provides the (M+1)-th positive data signal PS21 to the second positive data transmission line 413C and the (M+1)-th negative data signal NS21 to the second negative data transmission line 414C. The (2M)-th data signal driving unit DDU2M generates a (2M)-th positive data signal PS2M and a (2M)-th negative data signal NS2M based on the (2M)-th digital signal DI2M and a data transmission distance between the (2M)-th data signal driving unit DDU2M and the second data output unit 416C, and provides the (2M)-th positive data signal PS2M to the second positive data transmission line 413C and the (2M)-th negative data signal NS2M to the second negative data transmission line 414C.

In an example embodiment, each of the first and second data output unit 415C and 416C may be a sense amplifier.

Figure 24:
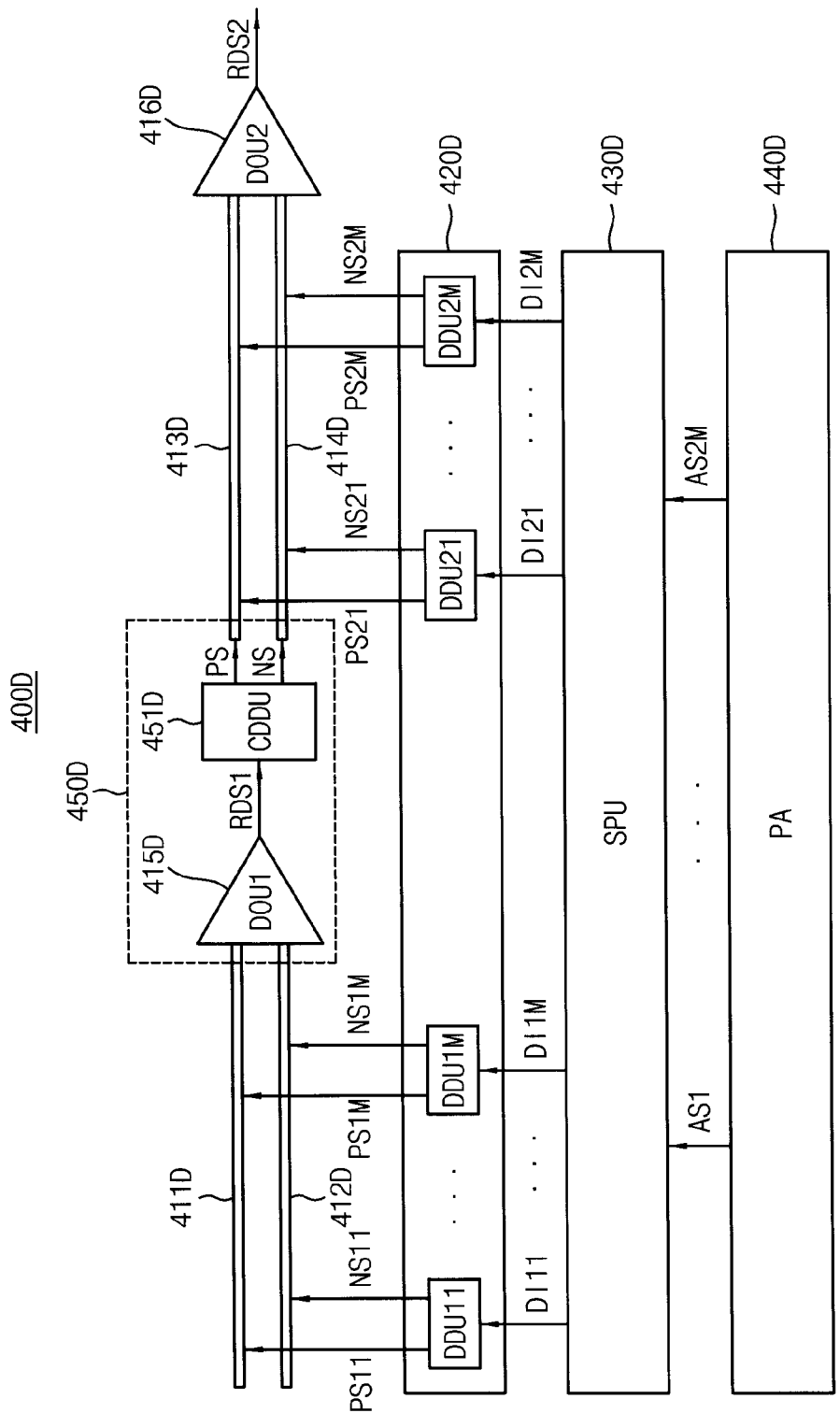

Referring to FIG. 24, an image sensor 400D includes a pixel array PA 440D, a signal processor SPU 430D, a first positive data transmission line 411D, a first negative data transmission line 412D, a second positive data transmission line 413D, a second negative data transmission line 414D, a first data output unit 415D, a second data output unit 416D, a link data signal driving unit CDDU 451D and a data signal driving circuit 420D. The data signal driving circuit 420D includes first through (M)-th data signal driving units DDU11 through DDU1M and (M+1)-th through (2M)-th data signal driving units DDU21 through DDU2M. In an example embodiment, the image sensor 400D may further include a positive data transmission line, a negative data transmission line, a data output unit, and a link data signal driving unit and the data signal driving circuit 420D may further include a data signal driving unit.

The pixel array 440D generates analog signals AS1 through AS2M representing a captured image. The signal processor 430D converts the analog signals AS1 through AS2M to first and second digital signals DI11 through DI1M, DI21 through DI2M. The first data output unit 415D is connected to the first positive data transmission line 411D and first negative data transmission line 412D and generates a first recovered data signal RDS1 based on data signals communicated via the first positive data transmission line 411D and first negative data transmission line 412D. The second data output unit 416D is connected to the second positive data transmission line 413D and second negative data transmission line 414D and generates a second recovered data signal RDS2 based on data signals communicated via the second positive data transmission line 413D and second negative data transmission line 414D.

The first through (M)-th data signal driving units DDU11 through DDU1M are respectively connected at different points along the first positive data transmission line 411D and first negative data transmission line 412D. The first data signal driving unit DDU11 generates a first positive data signal PS11 and a first negative data signal NS11 based on the first digital signal DI11 and a data transmission distance between the first data signal driving unit DDU11 and the first data output unit 415D, and provides the first positive data signal PS11 to the first positive data transmission line 411D and the first negative data signal NS11 to the first negative data transmission line 412D. The (M)-th data signal driving unit DDU1M generates a (M)-th positive data signal PS1M and a (M)-th negative data signal NS1M based on the (M)-th digital signal DI1M and a data transmission distance between the (M)-th data signal driving unit DDU1M and the first data output unit 415D, and provides the (M)-th positive data signal PS1M to the first positive data transmission line 411D and the (M)-th negative data signal NS1M to the first negative data transmission line 412D.

The (M+1)-th through (2M)-th data signal driving units DDU21 through DDU2M are respectively connected at different points along the second positive data transmission line 413D and second negative data transmission line 414D. The (M+1)-th data signal driving unit DDU21 generates a (M+1)-th positive data signal PS21 and a (M+1)-th negative data signal NS21 based on the (M+1)-th digital signal DI21 and a data transmission distance between the (M+1)-th data signal driving unit DDU21 and the second data output unit 416D, and provides the (M+1)-th positive data signal PS21 to the second positive data transmission line 413D and the (M+1)-th negative data signal NS21 to the second negative data transmission line 414D. The (2M)-th data signal driving unit DDU2M generates a (2M)-th positive data signal PS2M and a (2M)-th negative data signal NS2M based on the (2M)-th digital signal DI2M and a data transmission distance between the (2M)-th data signal driving unit DDU2M and the second data output unit 416D, and provides the (2M)-th positive data signal PS2M to the second positive data transmission line 413D and the (2M)-th negative data signal NS2M to the second negative data transmission line 414D.

The link data signal driving unit 451D and the first data output unit 415D may form a buffer circuit 450D. The link data signal driving unit 451D generates a positive link data signal PS and a negative link data signal NS by driving the first recovered data signal RDS1, and provides the positive link data signal PS to the second positive data transmission line 413D and the negative link data signal NS to the second negative data transmission line 414D. The first digital signals DI11 through DI1M may be outputted as the second recovered data signal RDS2 through the first recovered data signal RDS1, the positive link data signal PS and the negative link data signal NS.

Figure 25:
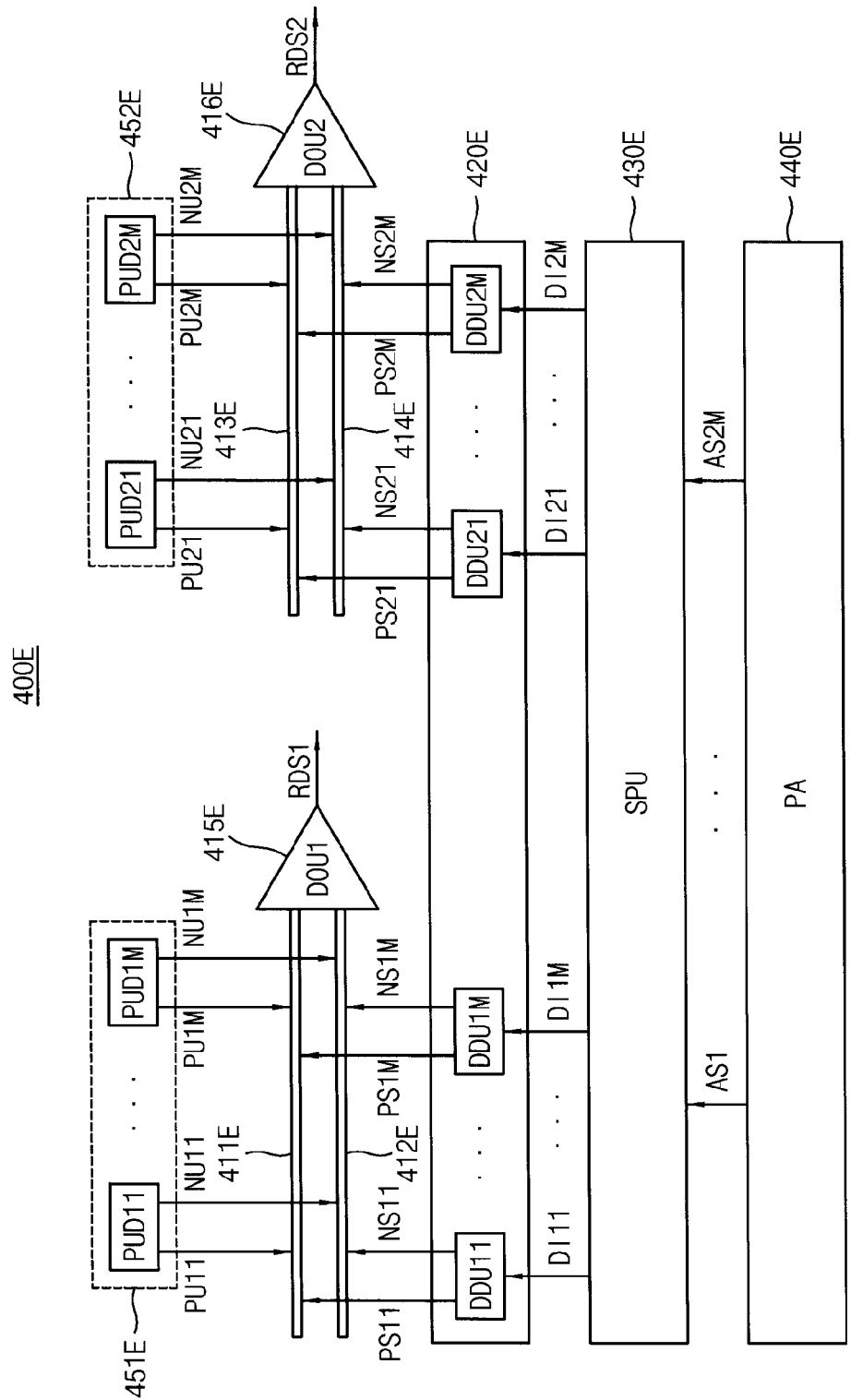

Referring to FIG. 25, an image sensor 400E includes a pixel array PA 440E, a signal processor SPU 430E, a first positive data transmission line 411E, a first negative data transmission line 412E, a second positive data transmission line 413E, a second negative data transmission line 414E, a first data output unit 415E, a second data output unit 416E, a data signal driving circuit 420D, first through (M)-th pull-up devices PUD11 through PUD1M 451E, and (M+1)-th through (2M)-th pull-up devices PUD21 through PUD2M 452E. The data signal driving circuit 420E includes first through (M)-th data signal driving units DDU11 through DDU1M and (M+1)-th through (2M)-th data signal driving units DDU21 through DDU2M. In an example embodiment, the image sensor 400E may further include a positive data transmission line, a negative data transmission line, a data output unit, and a pull-up device and the data signal driving circuit 420E may further include a data signal driving unit.

The pixel array 440E generates analog signals AS1 through AS2M representing a captured image. The signal processor 430E converts the analog signals AS1 through AS2M to first and second digital signals DI11 through DI1M, DI21 through DI2M. The first data output unit 415E is connected to the first positive data transmission line 411E and first negative data transmission line 412E and generates a first recovered data signal RDS1 based on data signals communicated via the first positive data transmission line 411E and first negative data transmission line 412E. The second data output unit 416E is connected to the second positive data transmission line 413E and second negative data transmission line 414E and generates a second recovered data signal RDS2 based on data signals communicated via the second positive data transmission line 413E and second negative data transmission line 414E.

The first through (M)-th data signal driving units DDU11 through DDU1M are respectively connected at different points along the first positive data transmission line 411E and first negative data transmission line 412E. The first data signal driving unit DDU11 generates a first positive data signal PS11 and a first negative data signal NS11 based on the first digital signal DI11 and a data transmission distance between the first data signal driving unit DDU11 and the first data output unit 415E, and provides the first positive data signal PS11 to the first positive data transmission line 411E and the first negative data signal NS11 to the first negative data transmission line 412E. The (M)-th data signal driving unit DDU1M generates a (M)-th positive data signal PS1M and a (M)-th negative data signal NS1M based on the (M)-th digital signal DI1M and a data transmission distance between the (M)-th data signal driving unit DDU1M and the first data output unit 415E, and provides the (M)-th positive data signal PS1M to the first positive data transmission line 411E and the (M)-th negative data signal NS1M to the first negative data transmission line 412E.

The (M+1)-th through (2M)-th data signal driving units DDU21 through DDU2M are respectively connected at different points along the second positive data transmission line 413E and second negative data transmission line 414E. The (M+1)-th data signal driving unit DDU21 generates a (M+1)-th positive data signal PS21 and a (M+1)-th negative data signal NS21 based on the (M+1)-th digital signal DI21 and a data transmission distance between the (M+1)-th data signal driving unit DDU21 and the second data output unit 416E, and provides the (M+1)-th positive data signal PS21 to the second positive data transmission line 413E and the (M+1)-th negative data signal NS21 to the second negative data transmission line 414E. The (2M)-th data signal driving unit DDU2M generates a (2M)-th positive data signal PS2M and a (2M)-th negative data signal NS2M based on the (2M)-th digital signal DI2M and a data transmission distance between the (2M)-th data signal driving unit DDU2M and the second data output unit 416E, and provides the (2M)-th positive data signal PS2M to the second positive data transmission line 413E and the (2M)-th negative data signal NS2M to the second negative data transmission line 414E.

The first through (M)-th pull-up devices 451E may be respectively connected at different points along the first positive data transmission line 411E and the first negative data transmission line 412E, and the first through (M)-th pull-up devices 451E may correspond to the first through (M)-th data signal driving units DDU11 through DDU1M respectively. The (M+1)-th through (2M)-th pull-up devices 452E may be respectively connected at different points along the second positive data transmission line 413E and the second negative data transmission line 414E, and the (M+1)-th through (2M)-th pull-up devices 452E may correspond to the (M+1)-th through (2M)-th data signal driving units DDU21 through DDU2M respectively, The first pull-up device PUD11 may generate a first positive pull-up signal PI11 and a first negative pull-up signal NU11 based on a data transmission distance between the first data signal driving unit DDU11 corresponding to the first pull-up device PUD11 and the first data output unit 415E, and provides the first positive pull-up signal PU11 to the first positive data transmission line 411E and the first negative pull-up signal NU11 to the first negative data transmission line 412E. The (M)-th pull-up device PUD1M may generate a (M)-th positive pull-up signal PI1M and a (M)-th negative pull-up signal NU1M based on a data transmission distance between the (M)-th data signal driving unit DDU1M corresponding to the (M)-th pull-up device PUD1M and the first data output unit 415E, and provides the (M)-th positive pull-up signal PU1M to the first positive data transmission line 411E and the (M)-th negative pull-up signal NU1M to the first negative data transmission line 412E.

The (M+1)-th pull-up device PUD21 may generate a (M+1)-th positive pull-up signal PI21 and a (M+1)-th negative pull-up signal NU21 based on a data transmission distance between the (M+1)-th data signal driving unit DDU21 corresponding to the (M+1)-th pull-up device PUD21 and the second data output unit 416E, and provides the (M+1)-th positive pull-up signal PU21 to the second positive data transmission line 413E and the (M+1)-th negative pull-up signal NU21 to the second negative data transmission line 414E. The (2M)-th pull-up device PUD2M may generate a (2M)-th positive pull-up signal PI2M and a (2M)-th negative pull-up signal NU2M based on a data transmission distance between the (2M)-th data signal driving unit DDU2M corresponding to the (2M)-th pull-up device PUD2M and the second data output unit 416E, and provides the (2M)-th positive pull-up signal PU2M to the second positive data transmission line 413E and the (2M)-th negative pull-up signal NU2M to the second negative data transmission line 414E.

Figure 26:
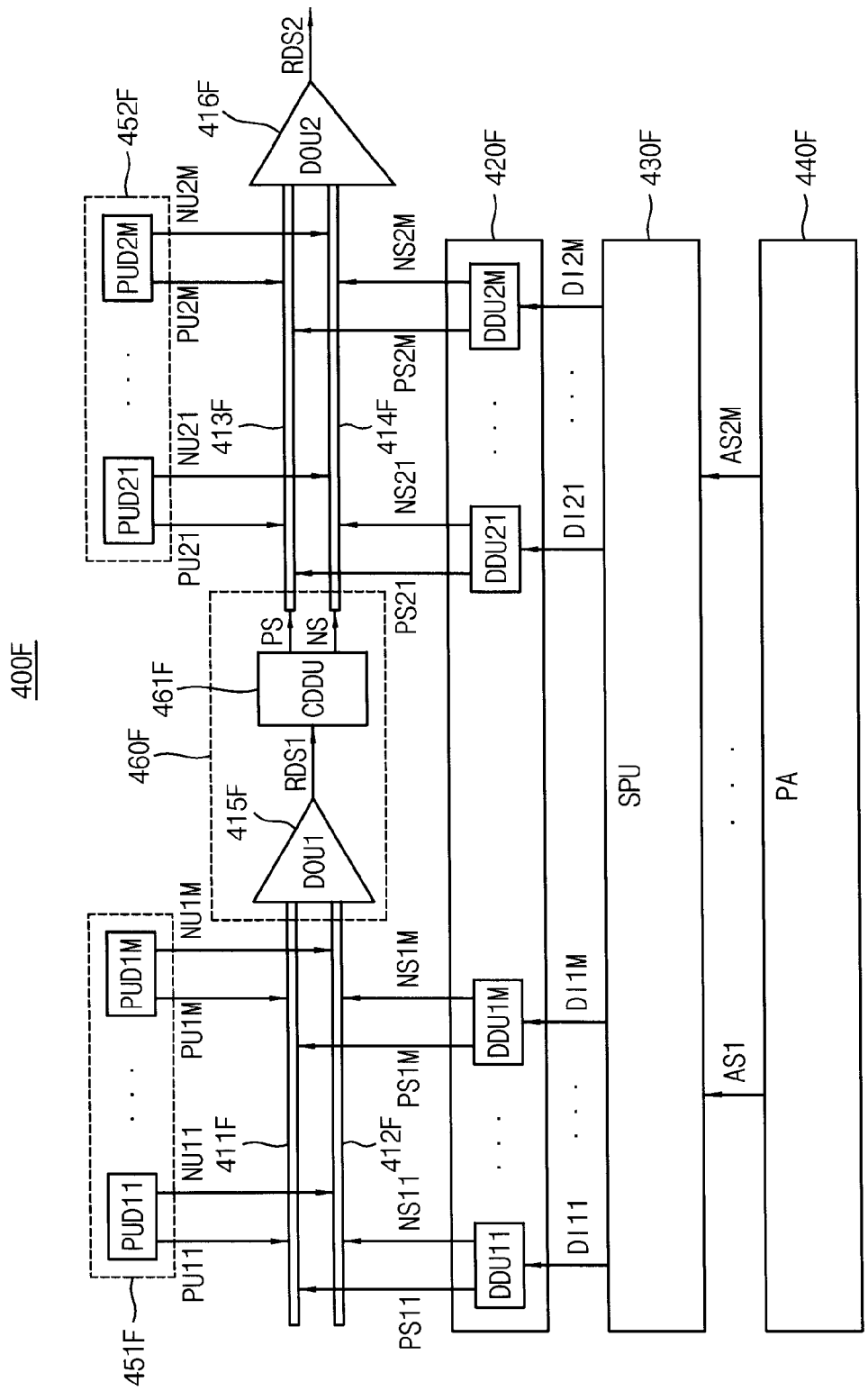

Referring to FIG. 26, an image sensor 400F includes a pixel array PA 440F, a signal processor SPU 430F, a first positive data transmission line 411F, a first negative data transmission line 412F, a second positive data transmission line 413F, a second negative data transmission line 414F, a first data output unit 415F, a second data output unit 416F, a data signal driving circuit 420F, first through (M)-th pull-up devices PUD11 through PUD1M 451F, (M+1)-th through (2M)-th pull-up devices PUD21 through PUD2M 452F, and a link data signal driving unit CDDU 461F. The data signal driving circuit 420F includes first through (M)-th data signal driving units DDU11 through DDU1M and (M+1)-th through (2M)-th data signal driving units DDU21 through DDU2M. In an example embodiment, the image sensor 400F may further include a positive data transmission line, a negative data transmission line, a data output unit, and a link data signal driving unit and the data signal driving circuit 420F may further include a data signal driving unit.

The pixel array 440F generates analog signals AS1 through AS2M representing a captured image. The signal processor 430F converts the analog signals AS1 through AS2M to first and second digital signals DI1 1 through DI1M, DI21 through DI2M. The first data output unit 415F is connected to the first positive data transmission line 411F and first negative data transmission line 412F and generates a first recovered data signal RDS1 based on data signals communicated via the first positive data transmission line 411F and first negative data transmission line 412F. The second data output unit 416F is connected to the second positive data transmission line 413F and second negative data transmission line 414F and generates a second recovered data signal RDS2 based on data signals communicated via the second positive data transmission line 413F and second negative data transmission line 414F.

The first through (M)-th data signal driving units DDU11 through DDU1M are respectively connected at different points along the first positive data transmission line 411F and first negative data transmission line 412F. The first data signal driving unit DDU11 generates a first positive data signal PS11 and a first negative data signal NS11 based on the first digital signal DI11 and a data transmission distance between the first data signal driving unit DDU11 and the first data output unit 415F, and provides the first positive data signal PS11 to the first positive data transmission line 411F and the first negative data signal NS11 to the first negative data transmission line 412F. The (M)-th data signal driving unit DDU1M generates a (M)-th positive data signal PS1M and a (M)-th negative data signal NS1M based on the (M)-th digital signal DI1M and a data transmission distance between the (M)-th data signal driving unit DDU1M and the first data output unit 415F, and provides the (M)-th positive data signal PS1M to the first positive data transmission line 411F and the (M)-th negative data signal NS1M to the first negative data transmission line 412F.

The (M+1)-th through (2M)-th data signal driving units DDU21 through DDU2M are respectively connected at different points along the second positive data transmission line 413F and second negative data transmission line 414F. The (M+1)-th data signal driving unit DDU21 generates a (M+1)-th positive data signal PS21 and a (M+1)-th negative data signal NS21 based on the (M+1)-th digital signal DI21 and a data transmission distance between the (M+1)-th data signal driving unit DDU21 and the second data output unit 416F, and provides the (M+1)-th positive data signal PS21 to the second positive data transmission line 413F and the (M+1)-th negative data signal NS21 to the second negative data transmission line 414F. The (2M)-th data signal driving unit DDU2M generates a (2M)-th positive data signal PS2M and a (2M)-th negative data signal NS2M based on the (2M)-th digital signal DI2M and a data transmission distance between the (2M)-th data signal driving unit DDU2M and the second data output unit 416F, and provides the (2M)-th positive data signal PS2M to the second positive data transmission line 413F and the (2M)-th negative data signal NS2M to the second negative data transmission line 414F.

The first through (M)-th pull-up devices 451F may be respectively connected at different points along the first positive data transmission line 411F and the first negative data transmission line 412F, and the first through (M)-th pull-up devices 451F may correspond to the first through (M)-th data signal driving units DDU11 through DDU1M respectively. The (M+1)-th through (2M)-th pull-up devices 452F may be respectively connected at different points along the second positive data transmission line 413F and the second negative data transmission line 414F, and the (M+1)-th through (2M)-th pull-up devices 452F may correspond to the (M+1)-th through (2M)-th data signal driving units DDU21 through DDU2M respectively, The first pull-up device PUD11 may generate a first positive pull-up signal PI11 and a first negative pull-up signal NU11 based on a data transmission distance between the first data signal driving unit DDU11 corresponding to the first pull-up device PUD11 and the first data output unit 415F, and provides the first positive pull-up signal PU11 to the first positive data transmission line 411F and the first negative pull-up signal NU11 to the first negative data transmission line 412F. The (M)-th pull-up device PUD1M may generate a (M)-th positive pull-up signal PI1M and a (M)-th negative pull-up signal NU1M based on a data transmission distance between the (M)-th data signal driving unit DDU1M corresponding to the (M)-th pull-up device PUD1M and the first data output unit 415F, and provides the (M)-th positive pull-up signal PU1M to the first positive data transmission line 411F and the (M)-th negative pull-up signal NU1M to the first negative data transmission line 412F.

The (M+1)-th pull-up device PUD21 may generate a (M+1)-th positive pull-up signal PI21 and a (M+1)-th negative pull-up signal NU21 based on a data transmission distance between the (M+1)-th data signal driving unit DDU21 corresponding to the (M+1)-th pull-up device PUD21 and the second data output unit 416F, and provides the (M+1)-th positive pull-up signal PU21 to the second positive data transmission line 413F and the (M+1)-th negative pull-up signal NU21 to the second negative data transmission line 414F. The (2M)-th pull-up device PUD2M may generate a (2M)-th positive pull-up signal PI2M and a (2M)-th negative pull-up signal NU2M based on a data transmission distance between the (2M)-th data signal driving unit DDU2M corresponding to the (2M)-th pull-up device PUD2M and the second data output unit 416F, and provides the (2M)-th positive pull-up signal PU2M to the second positive data transmission line 413F and the (2M)-th negative pull-up signal NU2M to the second negative data transmission line 414F.

The link data signal driving unit 461F and the first data output unit 415F may form a buffer circuit 460F. The link data signal driving unit 461F generates a positive link data signal PS and a negative link data signal NS by driving the first recovered data signal RDS1, and provides the positive link data signal PS to the second positive data transmission line 413F and the negative link data signal NS to the second negative data transmission line 414F. The first digital signals DI11 through DI1M may be outputted as the second recovered data signal RDS2 through the first recovered data signal RDS1, the positive link data signal PS and the negative link data signal NS.

Figure 27:
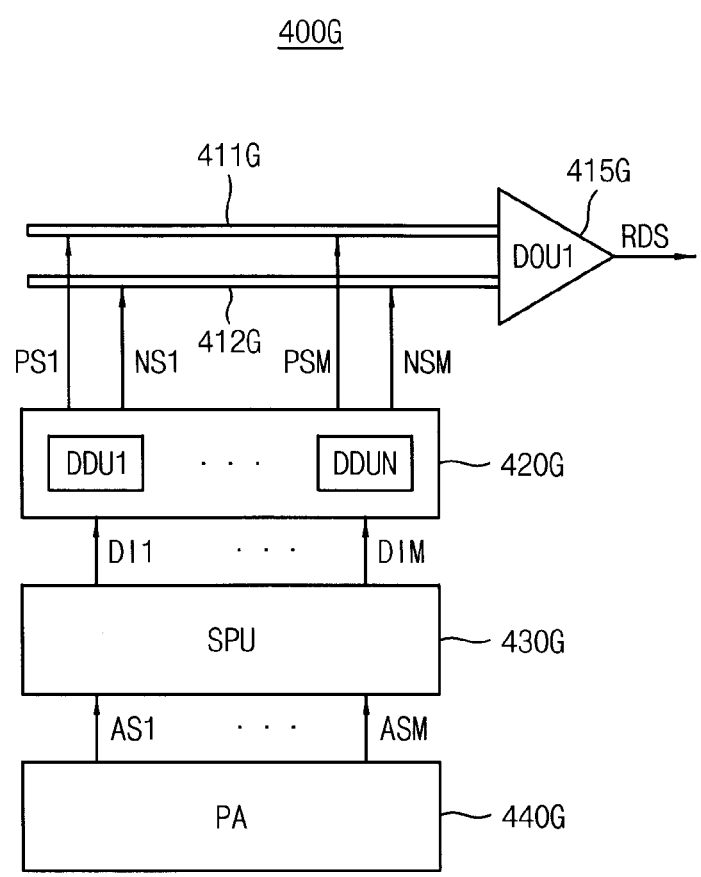

Referring to FIG. 27, an image sensor 400G includes a pixel array PA 440G, a signal processor SPU 430G, a positive data transmission line 411G, a negative data transmission line 412G, a data output unit 415G, and a data signal driving circuit 420G. The data signal driving circuit 420G includes first through (N)-th data signal driving units DDU11 through DDU1N (N is a natural number which is less than or equal to M). In an example embodiment, the image sensor 400G may further include a positive data transmission line, a negative data transmission line, and a data output unit and the data signal driving circuit 420G may further include a data signal driving unit.

The pixel array 440G generates analog signals AS1 through ASM representing a captured image. The signal processor 430G converts the analog signals AS1 through ASM to digital signals DI1 through DIM. The data output unit 415G is connected to the positive data transmission line 411G and negative data transmission line 412G and generates a recovered data signal RDS based on data signals communicated via the positive data transmission line 411G and negative data transmission line 412G.

The first through (N)-th data signal driving units DDU1 through DDUN are respectively connected at different points along the positive data transmission line 411G and negative data transmission line 412G. The first data signal driving unit DDU1 generates at least one first positive data signal and at least one first negative data signal based on at least one first digital signal among the digital signals DI1 through DIM and a data transmission distance between the first data signal driving unit DDU1 and the data output unit 415G, and provides the at least one first positive data signal to the positive data transmission line 411G and the at least one first negative data signal to the first negative data transmission line 412G. The (N)-th data signal driving unit DDUN generates at least one (N)-th positive data signal and at least one (N)-th negative data signal based on at least one (N)-th digital signal among the digital signals DI1 through DIM and a data transmission distance between the (N)-th data signal driving unit DDUN and the data output unit 415G, and provides the at least one (N)-th positive data signal to the positive data transmission line 411G and the at least one (N)-th negative data signal to the first negative data transmission line 412G.

Figure 28:
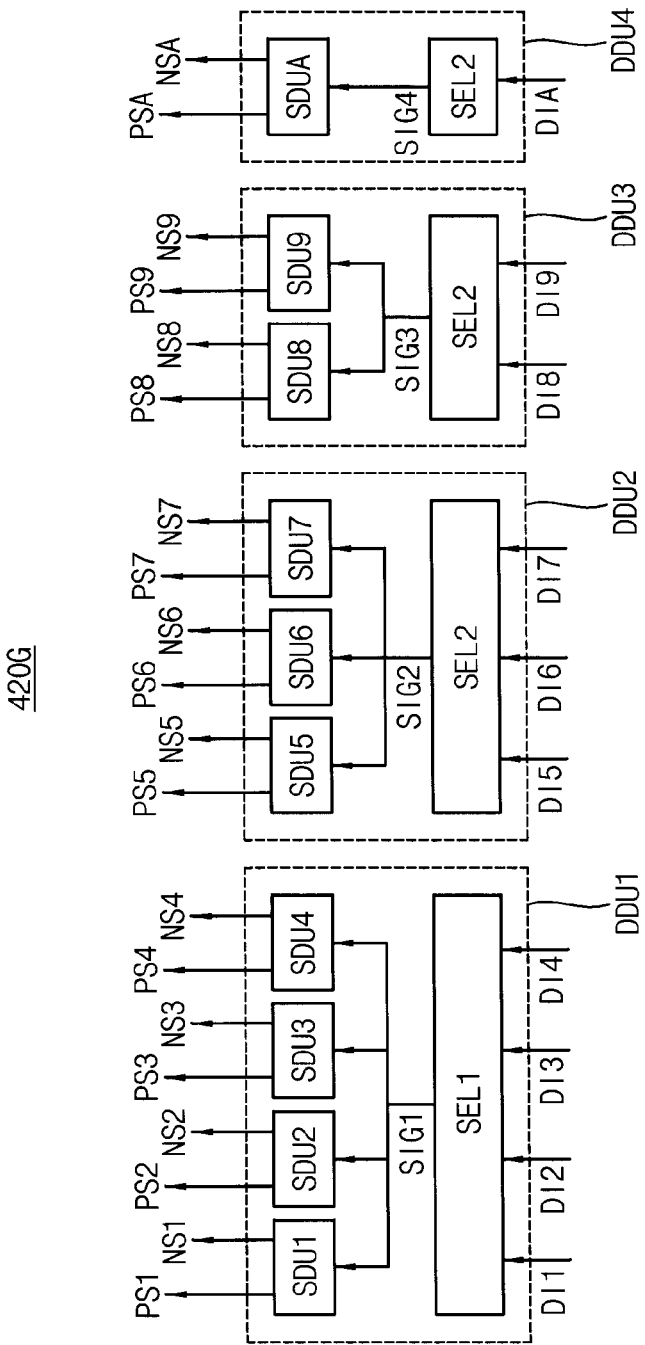
FIG. 28 is a block diagram illustrating the data signal driving circuit included in the image sensor of FIG. 27.

FIG. 28 illustrates the data signal driving circuit included in the image sensor of FIG. 27. The data signal driving circuit 420G may be implemented with another structure different from FIG. 28.

Referring to FIG. 28, the data signal driving circuit 420G includes first through fourth data signal driving units DDU1, DDU2, DDU3, and DDU4 (M is 10, and N is 4). In an example embodiment, the data signal driving circuit 420G may further include a data signal driving unit. The first data signal driving unit DDU1 includes first through fourth sub data signal driving units SDU1, SDU2, SDU3, and SDU4 and a first selection circuit SEL1. The first selection circuit SEL1 selects an activated digital signal among the first through fourth digital signals DI1, DI2, DI3, and DI4 as a first base signal SIG1. The first through fourth sub data signal driving units SDU1, SDU2, SDU3, and SDU4 generates the first through fourth positive data signals PS1, PS2, PS3, and PS4 and the first through fourth negative data signals NS1, NS2, NS3, and NS4 by driving the first base signal SIG1, and provides the first through fourth positive data signals PS1, PS2, PS3, and PS4 to the positive data transmission line 411G and the first through fourth negative data signals NS1, NS2, NS3, and NS4 to the negative data transmission line 412G, The second data signal driving unit DDU2 includes fifth through seventh sub data signal driving units SDU5, SDU6, and SDU7 and a second selection circuit SEL2. The second selection circuit SEL2 selects an activated digital signal among the fifth through seventh digital signals DI5, DI6, and DI7 as a second base signal SIG2. The fifth through seventh sub data signal driving units SDU5, SDU6, and SDU7 generates the fifth through seventh positive data signals PS5, PS6, and PS7 and the fifth through seventh negative data signals NS5, NS6, and NS7 by driving the second base signal SIG2, and provides the fifth through seventh positive data signals PS5, PS6, and PS7 to the positive data transmission line 411G and the fifth through seventh negative data signals NS5, NS6, and NS7 to the negative data transmission line 412G, The third and fourth data signal driving units DDU3 and DDU4 may be understood based on the description.

In an example embodiment, the sub data signal driving units SDU1 through SDUA may have the same current driving power. The first data signal driving unit DDU1 may include 4 sub data signal driving units SDU1, SDU2, SDU3, and SDU4 in proportion to data transmission distance between the first selection circuit SEL1 and the data output unit 415G. The second data signal driving unit DDU2 may include 3 sub data signal driving units SDU5, SDU6, and SDU7 in proportion to data transmission distance between the second selection circuit SEL2 and the data output unit 415G. The third data signal driving unit DDU3 may include 2 sub data signal driving units SDU8 and SDU9 in proportion to data transmission distance between the third selection circuit SEL3 and the data output unit 415G. The fourth data signal driving unit DDU4 may include 1 sub data signal driving unit SDUA in proportion to data transmission distance between the fourth selection circuit SEL4 and the data output unit 415G.

FIGS. 29 through 32 are block diagrams illustrating certain image sensors according to various embodiments of the inventive concept.

Figure 29:
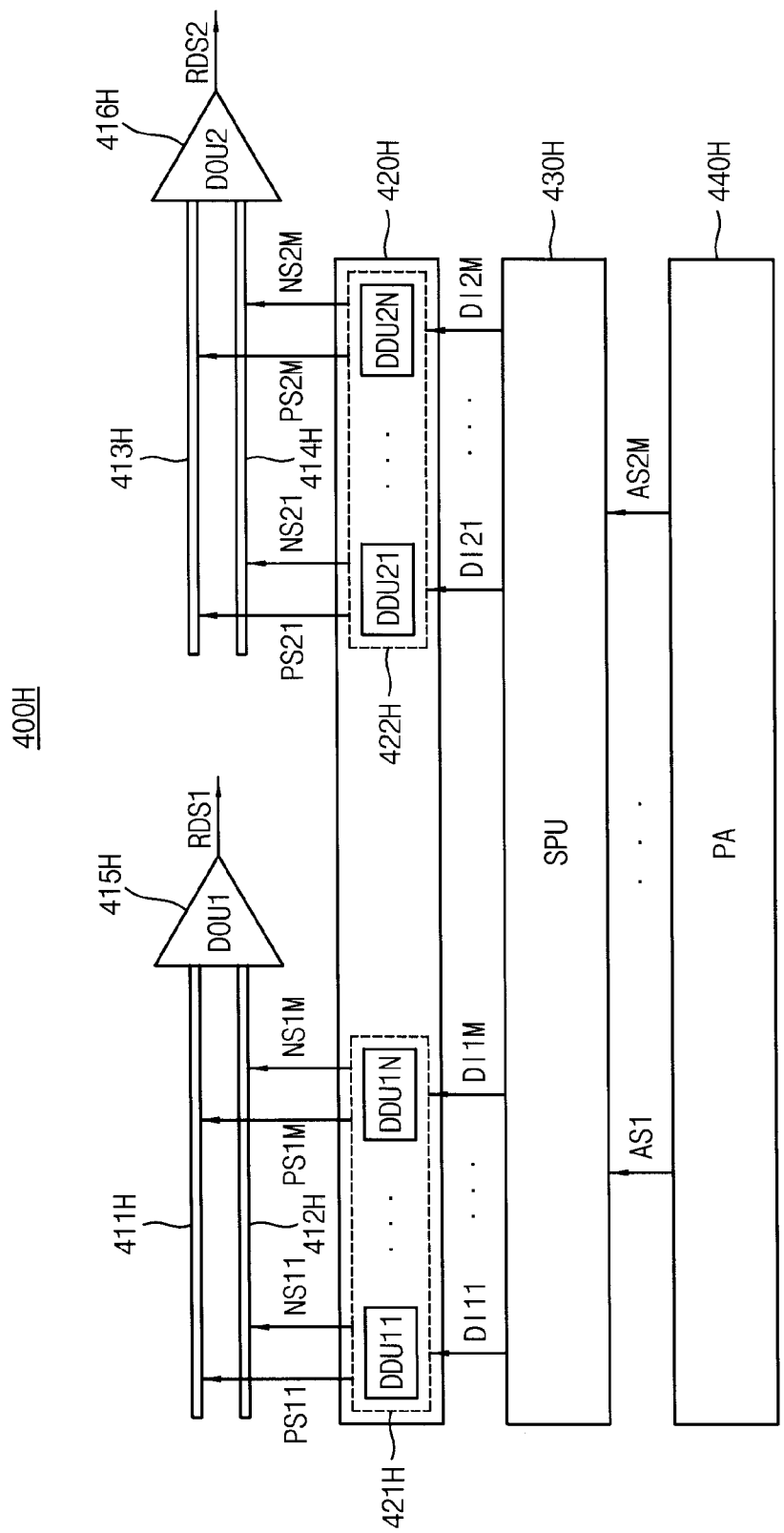
FIGS. 29 through 32 are block diagrams illustrating certain image sensors according to various embodiments of the inventive concept.

Referring to FIG. 29, an image sensor 400H includes a pixel array PA 440H, a signal processor SPU 430H, a first positive data transmission line 411H, a first negative data transmission line 412H, a second positive data transmission line 413H, a second negative data transmission line 414H, a first data output unit 415H, a second data output unit 416H, and a data signal driving circuit 420H. The data signal driving circuit 420H includes a first internal data signal driving circuit 421H and a second internal data signal driving circuit 422H. In an example embodiment, the image sensor 400H may further include a positive data transmission line, a negative data transmission line, and a data output unit and the data signal driving circuit 420H may further include an internal data signal driving circuit.

Each of the first and second internal data signal driving circuits 421H and 422H may have the same or similar structure with the data signal driving circuit 420G of FIG. 28. The first and second internal data signal driving circuits 421H and 422H may be understood based on the reference to FIG. 28. The remaining of FIG. 29 may be understood based on the reference to FIG. 23.

Figure 30:
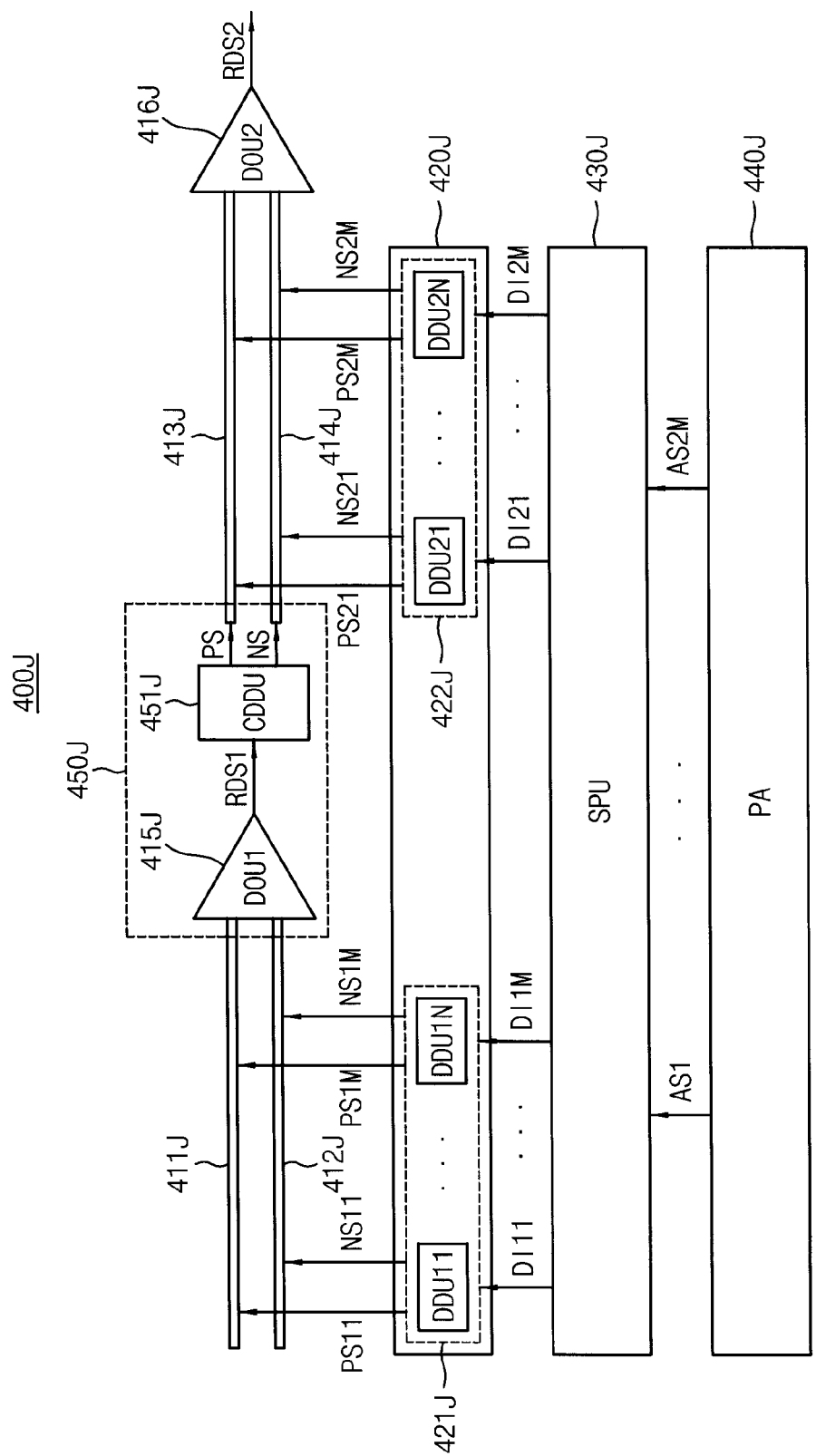

Referring to FIG. 30, an image sensor 400J includes a pixel array PA 440J, a signal processor SPU 430J, a first positive data transmission line 411J, a first negative data transmission line 412J, a second positive data transmission line 413J, a second negative data transmission line 414J, a first data output unit 415J, a second data output unit 416J, a link data signal driving unit CDDU 451J and a data signal driving circuit 420J. The data signal driving circuit 420J includes a first internal data signal driving circuit 421J and a second internal data signal driving circuit 422J. In an example embodiment, the image sensor 400J may further include a positive data transmission line, a negative data transmission line, a data output unit, and a link data signal driving unit and the data signal driving circuit 420J may further include an internal data signal driving circuit.

Each of the first and second internal data signal driving circuits 421J and 422J may have the same or similar structure with the data signal driving circuit 420G of FIG. 28. The first and second internal data signal driving circuits 421J and 422J may be understood based on the reference to FIG. 28. The remaining of FIG. 30 may be understood based on the reference to FIG. 24.

Figure 31:
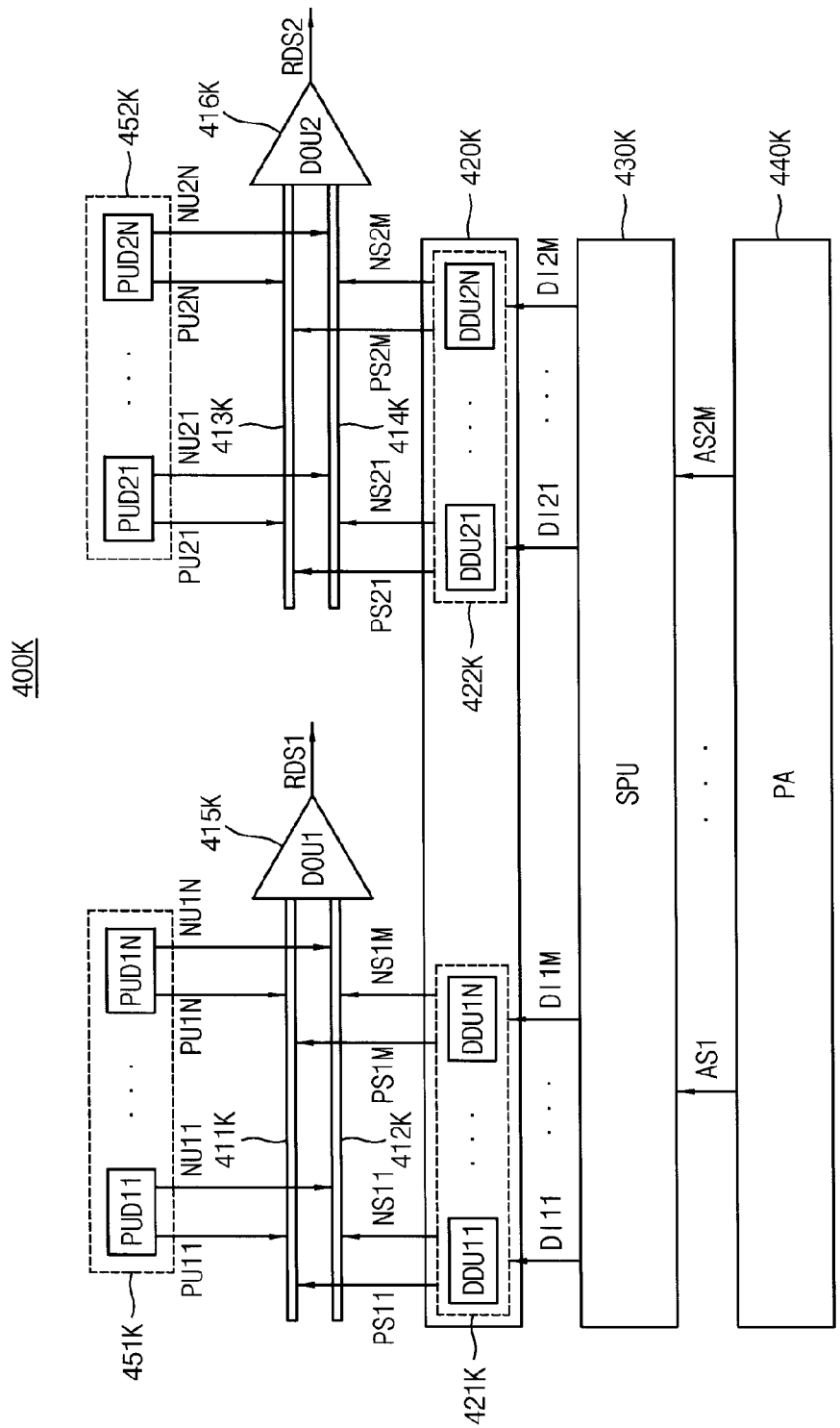

Referring to FIG. 31, an image sensor 400K includes a pixel array PA 440K, a signal processor SPU 430K, a first positive data transmission line 411K, a first negative data transmission line 412K, a second positive data transmission line 413K, a second negative data transmission line 414K, a first data output unit 415K, a second data output unit 416K, a data signal driving circuit 420K, first through (N)-th pull-up devices PUD11 through PUD1N 451K, and (N+1)-th through (2N)-th pull-up devices PUD21 through PUD2N 452K. The data signal driving circuit 420K includes a first internal data signal driving circuit 421K and a second internal data signal driving circuit 422K. In an example embodiment, the image sensor 400K may further include a positive data transmission line, a negative data transmission line, a data output unit, and a pull-up device and the data signal driving circuit 420K may further include an internal data signal driving circuit.

Each of the first and second internal data signal driving circuits 421K and 422K may have the same or similar structure with the data signal driving circuit 420G of FIG. 28. The first and second internal data signal driving circuits 421K and 422K may be understood based on the reference to FIG. 28. The remaining of FIG. 31 may be understood based on the reference to FIG. 25.

Figure 32:
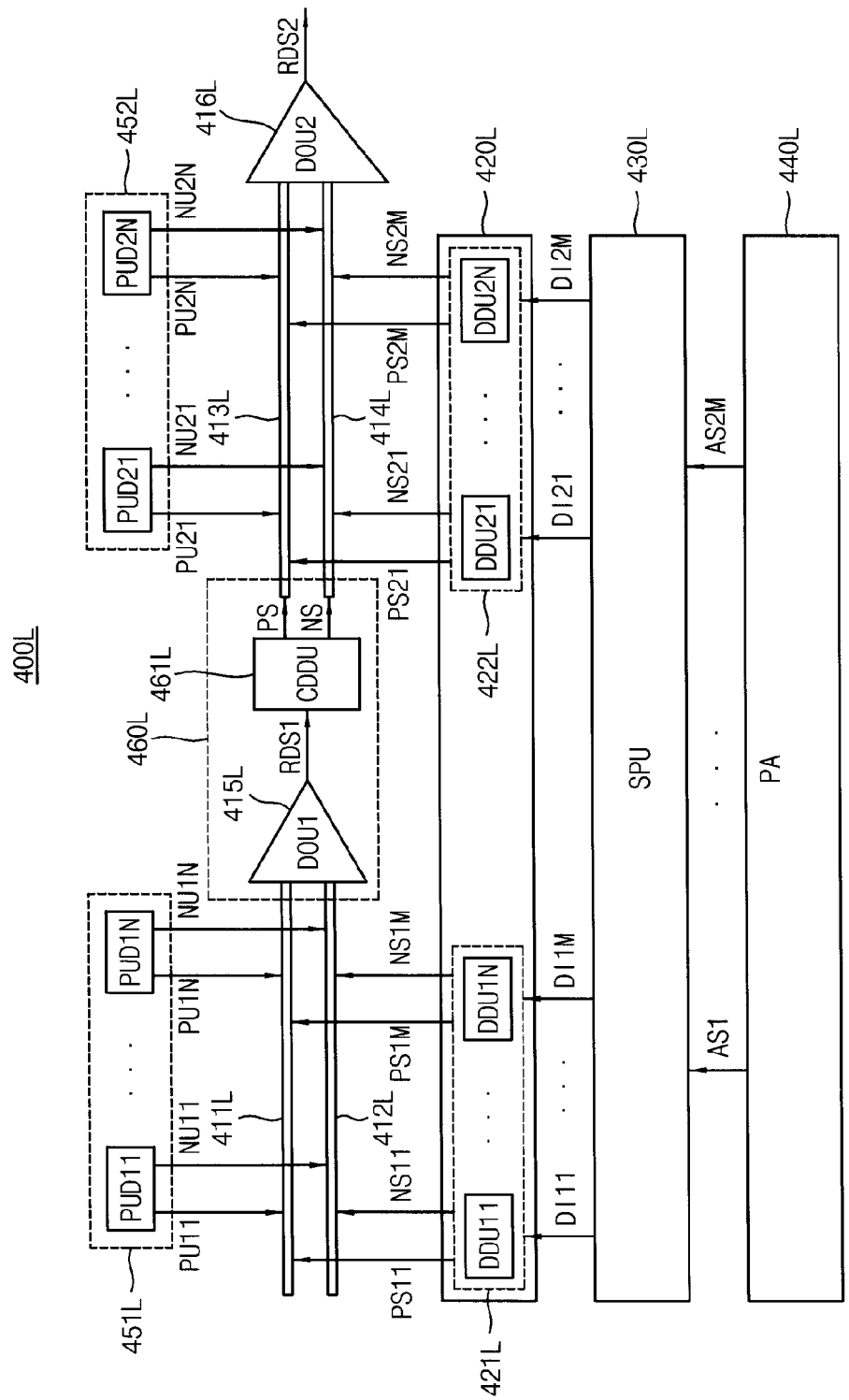

Referring to FIG. 32, an image sensor 400L includes a pixel array PA 440L, a signal processor SPU 430L, a first positive data transmission line 411L, a first negative data transmission line 412L, a second positive data transmission line 413L, a second negative data transmission line 414L, a first data output unit 415L, a second data output unit 416L, a link data signal driving unit CDDU 461L, a data signal driving circuit 420L, first through (N)-th pull-up devices PUD11 through PUD1N 451L, and (N+1)-th through (2N)-th pull-up devices PUD21 through PUD2N 452L. The data signal driving circuit 420L includes a first internal data signal driving circuit 421L and a second internal data signal driving circuit 422L. In an example embodiment, the image sensor 400L may further include a positive data transmission line, a negative data transmission line, a data output unit, a link data signal driving unit, and a pull-up device and the data signal driving circuit 420L may further include an internal data signal driving circuit.

Each of the first and second internal data signal driving circuits 421L and 422L may have the same or similar structure with the data signal driving circuit 420G of FIG. 28. The first and second internal data signal driving circuits 421L and 422L may be understood based on the reference to FIG. 28. The remaining of FIG. 32 may be understood based on the reference to FIG. 26.

Figure 33:
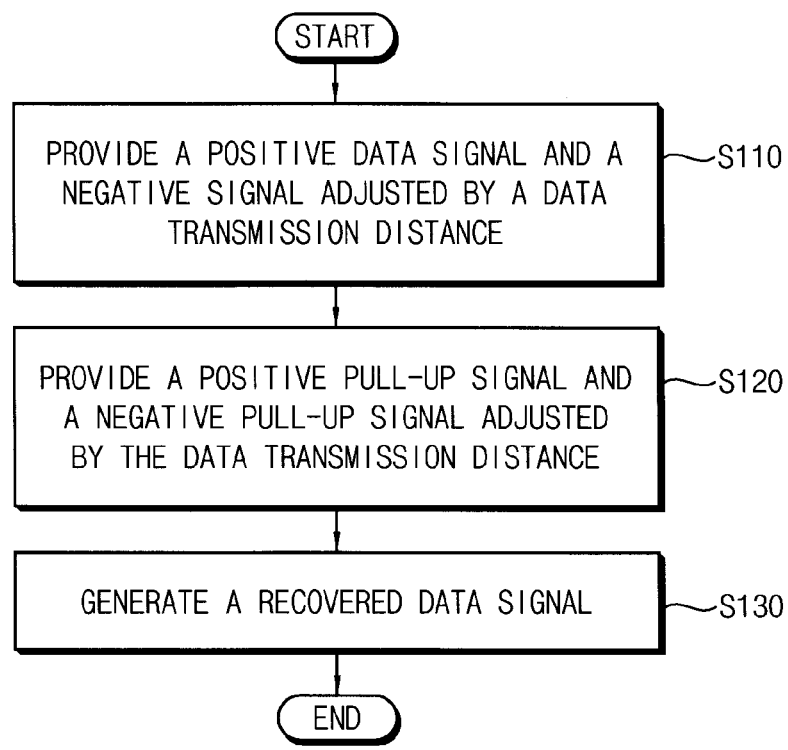
FIG. 33 is a flow chart summarizing in one example a method of transmitting data according to certain embodiments of the inventive concept.

FIG. 33 is a flow chart summarizing in one example a method of transmitting data according to certain embodiments of the inventive concept.

Referring to FIG. 33, a data signal driving unit provides a positive data signal and a negative data signal (S110). Here, the positive data signal and the negative data signal may be generated based on (of adjusted for) a data input signal and in view of a data transmission distance between the data signal driving unit and a data output unit. A pull-up device corresponding to the data signal driving unit may be used to provide a positive pull-up signal and a negative pull-up signal (S120). Again, the positive pull-up signal and negative pull-up signal may be generated based on the data transmission distance. Then, a data output unit may be used to generate a recovered data signal based on signals communicated via the positive data transmission line and negative data transmission line (S130).

The step of providing the positive data signal and negative data signal (S110) and the step of providing a positive pull-up signal and negative pull-up signal (S130) may be performed simultaneously, in a temporally overlapping manner, or completely separate from one another.

Figure 34:
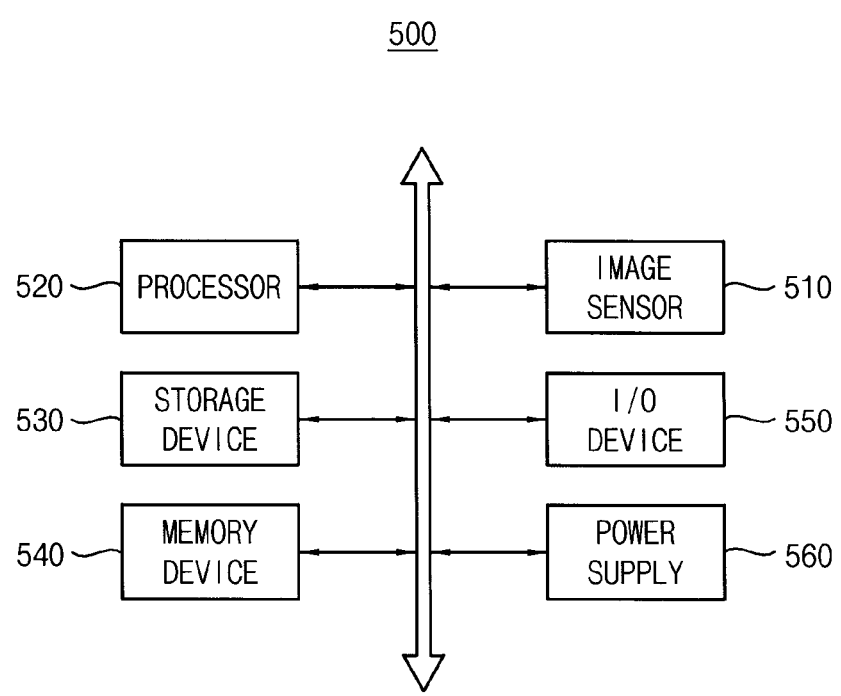
FIG. 34 is a block diagram illustrating a computing system that may be configured to incorporate one or more data transmission circuits according to certain embodiments of the inventive concept.

FIG. 34 is a block diagram illustrating a computing system according to certain embodiments of the inventive concept.

Referring to FIG. 34, a computing system 500 comprises an image sensor 510, a processor 520 and a storage device 530.

The image sensor 510 may generate digital data corresponding to an incident light, and the storage device 530 may then store the resulting digital data, where the processor 520 may be used to control the overall operation of the image sensor 510 and storage device 530.

The computing system 500 may further comprise a memory device 540, an input/output device 550 and a power supply 560. Although it is not shown in FIG. 24, the computing system 500 may also include ports configured to communicate with a video card, a sound card, a memory card, a universal serial bus (USB) device, or other electronic devices.

The processor 520 may be sued to perform various computational and logical operations, and in certain embodiments may be a microprocessor or a Central Processing Unit (CPU). The processor 520 may communicate with the storage device 530, the memory device 540 and the input/output device 550 via an address bus, a control bus, and/or a data bus. In some embodiments, the processor 520 may be coupled to an extended bus, such as a peripheral component interconnection (PCI) bus.

The storage device 530 may include a non-volatile memory device such as a flash memory device, a solid state drive (SSD), a hard disk drive (HDD), a compact disk read-only memory (CD-ROM) drive, etc.

The memory device 540 may store data required for an operation of the electronic device 500. The memory device 540 may be a dynamic random access memory (DRAM), a static random access memory (SRAM), or a non-volatile memory, such as an erasable programmable read-only memory (EPROM), an electrically erasable programmable read-only memory (EEPROM), a flash memory, etc.

The input/output device 550 may include a keyboard, a mouse, a printer, a display device, etc. The power supply 560 may supply operational power.

The image sensor 510 may be connected to the processor 520 through one or more of the above buses or other communication links to communicate with the processor 520. The image sensor 510 may include a pixel array that detects incident light to generate an analog signal, and an analog-digital conversion unit that performs a sigma-delta analog-digital conversion and a cyclic analog-digital conversion with respect to the analog signal to generate a digital signal in a first operation mode and performs a single-slope analog-digital conversion with respect to the analog signal to generate the digital signal in a second operation mode.

The image sensor 510 may include the data transmission circuit 100 of FIG. 1 or the data transmission circuit 300 of FIG. 13. The image sensor 510 may be one of the image sensors 400, 400A, 400B, 400C, 400D, 400E, 400F, 400G, 400H, 400J, 400K, and 400L of FIGS. 20 through 27 and FIGS. 29 through 32. The image sensor 510 may be understood based on the references to FIGS. 1 through 32.

The image sensor 510 may be packaged in various forms, such as package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline IC (SOIC), shrink small outline package (SSOP), thin small outline package (TSOP), system in package (SIP), multi chip package (MCP), wafer-level fabricated package (WFP), or wafer-level processed stack package (WSP).

According to embodiments, the image sensor 510 may be integrated with the processor 520 in one chip, or the image sensor 510 and the processor 520 may be implemented as separate chips.

The computing system 500 may be any computing system using an image sensor. For example, the computing system 500 may include a digital camera, a mobile phone, a smart phone, a portable multimedia player (PMP), a personal digital assistant (PDA), etc.

Figure 35:
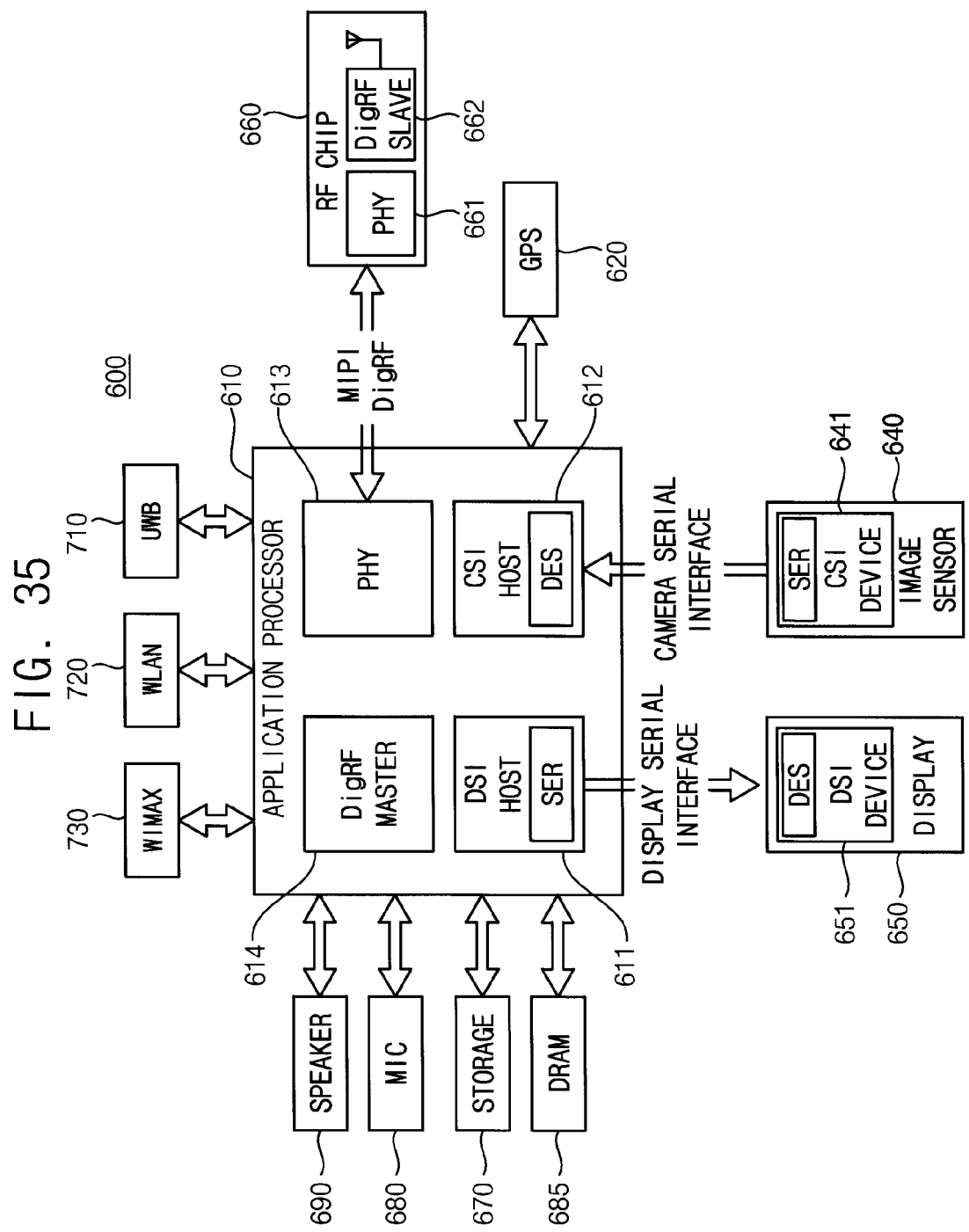
FIG. 35 is a block diagram illustrating in one example an interface that may be included in the computing system of FIG. 34.

FIG. 35 is another block diagram illustrating in one example of an interface that may be included in the computing system of FIG. 34.

Referring to FIG. 35, a computing system 600 may be implemented by a data processing device (e.g., a cellular phone, a personal digital assistant, a portable multimedia player, a smart phone, etc.) that uses or supports a mobile industry processor interface (MIPI) interface. The computing system 600 may include an application processor 610, an image sensor 640, a display device 650, etc.

A CSI host 612 of the application processor 610 may perform a serial communication with a CSI device 641 of the image sensor 640 via a camera serial interface (CSI). In some embodiments, the CSI host 612 may include a deserializer (DES), and the CSI device 641 may include a serializer (SER). A DSI host 611 of the application processor 610 may perform a serial communication with a DSI device 651 of the display device 650 via a display serial interface (DSI). In some embodiments, the DSI host 611 may include a serializer (SER), and the DSI device 651 may include a deserializer (DES).

The image sensor 640 may include the data transmission circuit 100 of FIG. 1 or the data transmission circuit 300 of FIG. 13. The image sensor 640 may be one of the image sensors 400, 400A, 400B, 400C, 400D, 400E, 400F, 400G, 400H, 400J, 400K, and 400L of FIGS. 20 through 27 and FIGS. 29 through 32. The image sensor 640 may be understood based on the references to FIGS. 1 through 32.

The computing system 600 may further include a radio frequency (RF) chip 660 performing a communication with the application processor 610. A physical layer (PHY) 613 of the computing system 600 and a physical layer (PHY) 661 of the RF chip 660 may perform data communications based on a MIPI DigRF. The application processor 610 may further include a DigRF MASTER 614 that controls the data communications according to the MIPI DigRF of the PHY 661, and the RF chip 660 may further include a DigRF SLAVE 662 controlled by the DigRF MASTER 614.

The computing system 600 may further include a global positioning system (GPS) 620, a storage 670, a MIC 680, a DRAM device 685, and a speaker 690. In addition, the computing system 600 may perform communications using an ultra wideband (UWB) 710, a wireless local area network (WLAN) 720, a worldwide interoperability for microwave access (WIMAX) 730, etc. However, the structure and the interface of the computing system 600 are not limited thereto.

The foregoing is illustrative in nature. Although a certain embodiments of the inventive concept have been described in detail, those skilled in the art will readily appreciate that many modifications are possible in these embodiments without materially departing from the novel teachings and advantages of the present inventive concept. Accordingly, all such modifications are intended to be included within the scope of the following claims. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims.

What is claimed is:

1. A data transmission circuit comprising:
   a positive data transmission line and a negative data transmission line;
   a data output unit connected to the positive data transmission line and negative data transmission line and configured to generate a recovered data signal based on data signals communicated via the positive data transmission line and negative data transmission line; and
   a plurality of data signal driving units respectively connected at different points along the positive data transmission line and negative data transmission line, each data signal driving unit being configured to generate a positive data signal and a negative data signal based on a data input signal and a data transmission distance between the data signal driving unit and the data output unit, and provide the positive data signal to the positive data transmission line and the negative data signal to the negative data transmission line,
   wherein for each one of the plurality of data signal driving units, a strength of the positive data signal and a strength of the negative data signal will vary in proportion to the data transmission distance.

2. The data transmission circuit of claim 1, wherein the strength of the positive data signal and the strength of the negative data signal are controlled according to a respective size of a driving transistor included in each one of the plurality of data signal driving units.

3. The data transmission circuit of claim 1, wherein the strength of the positive data signal and the strength of the negative data signal are controlled according to a strength of a current source included in each one of the plurality of data signal driving units.

4. The data transmission circuit of claim 1 further comprising:
   a plurality of pull-up devices, each respectively corresponding to one of the plurality of data signal driving units, each pull-up device being connected at one of the different points along the positive data transmission line and the negative data transmission line and being configured to generate a positive pull-up signal and a negative pull-up signal based on the data transmission distance, provide the positive pull-up signal to the positive data transmission line, and provide the negative pull-up signal to the negative data transmission line.

5. A data transmission circuit comprising:
   a positive data transmission line and a negative data transmission line;
   a data output unit connected to the positive data transmission line and negative data transmission line and configured to generate a recovered data signal based on data signals communicated via through the positive data transmission line and negative data transmission line;
   a plurality of data signal driving units respectively connected at different points along the positive data transmission line and negative data transmission line; and
   a plurality of pull-up devices respectively corresponding on a one-for-one basis with one of the plurality of data signal driving units and being connected at the different points along the positive data transmission line and negative data transmission line,
   wherein each data signal driving unit provides a positive data signal to the positive data transmission line and a negative data signal to the negative data transmission line, and
   each pull-up device provides a positive pull-up signal to the positive data transmission line and a negative pull-up signal to the negative data transmission line,
   wherein at least one of relative strengths of the respective positive data signals, negative data signals, positive pull-up signals, and negative pull-up signals is adjusted according to one of a number of data transmission distances respectively associated with each one of the plurality of data signal driving units and the data output unit, and
   wherein the pull-up devices are spatially separated from the data output block.

6. The data transmission circuit of claim 5, wherein the relative strengths of the positive pull-up signals and the negative pull-up signals are adjusted to be proportion to one of the number of data transmission distances.

7. The data transmission circuit of claim 6, wherein the relative strengths of each one of the positive pull-up signals and each one of the negative pull-up signals is controlled by a corresponding size of pull-up transistors included in at least one of the plurality of pull-up devices.

8. The data transmission circuit of claim 5, wherein each data signal driving unit provides a positive data signal and a negative data signal based on a data input signal and a corresponding one of the number of data transmission distances.

9. An image sensor comprising:
a pixel array configured to generate analog signals representing a captured image;
a signal processor configured to convert the analog signals to first and second digital signals;
a first positive data transmission line;
a first negative data transmission line;
a first data output unit connected to the first positive data transmission line and first negative data transmission line and configured to generate a first recovered data signal based on data signals communicated via the first positive data transmission line and first negative data transmission line; and
a data signal driving circuit including first through (M)-th data signal driving units (M is a natural number) respectively connected at different points along the first positive data transmission line and first negative data transmission line,
wherein the (K)-th data signal driving unit (K is a natural number which is less than or equal to M) is configured to generate at least one (K)-th positive data signal and at least one (K)-th negative data signal based on at least one (K)-th digital signal among the first digital signals and a data transmission distance between the (K)-th data signal driving unit and the first data output unit, and is configured to provide the at least one (K)-th positive data signal to the first positive data transmission line and the at least one (K)-th negative data signal to the first negative data transmission line,
wherein a strength of the at least one (K)-th positive data signal and a strength of the at least one (K)-th negative data signal will vary in proportion to the data transmission distance.

10. The image sensor of claim 9, wherein the image sensor further includes a second positive data transmission line, a second negative data transmission line, and a second data output unit,
wherein the second data output unit is connected to the second positive data transmission line and second negative data transmission line and is configured to generate a second recovered data signal based on data signals communicated via the second positive data transmission line and second negative data transmission line,
wherein the data signal driving circuit further includes (M+1)-th through (M+N)-th data signal driving units (N is a natural number) respectively connected at different points along the second positive data transmission line and second negative data transmission line,
wherein the (L)-th data signal driving unit (L is a natural number which is bigger than M, and is less than or equal to M+N) is configured to generate at least one (L)-th positive data signal and at least one (L)-th negative data signal based on at least one (L)-th digital signal included in the second digital signals and a data transmission distance between the (L)-th data signal driving unit and the second data output unit, and is configured to provide the at least one (L)-th positive data signal to the second positive data transmission line and the at least one (L)-th negative data signal to the second negative data transmission line.

11. The image sensor of claim 10, wherein the image sensor further includes a link data signal driving unit,
wherein the link data signal driving unit generates a positive link data signal and a negative link data signal by driving the first recovered data signal, and provides the positive link data signal to the second positive data transmission line and the negative link data signal to the second negative data transmission line.

12. The image sensor of claim 11, wherein the first digital signals are outputted as the second recovered data signal through the first recovered data signal, the positive link data signal and the negative link data signal.

13. The image sensor of claim 10, wherein the image sensor further includes first through (M)-th pull-up devices and (M+1)-th through (M+N)-th pull-up devices,
wherein the first through (M)-th pull-up devices are respectively connected at different points along the first positive data transmission line and the first negative data transmission line, and the first through (M)-th pull-up devices correspond to the first through (M)-th data signal driving units respectively,
wherein the (M+1)-th through (M+N)-th pull-up devices are respectively connected at different points along the second positive data transmission line and the second negative data transmission line, and the (M+1)-th through (M+N)-th pull-up devices correspond to the (M+1)-th through (M+N)-th data signal driving units respectively,
wherein the (K)-th pull-up device generates a (K)-th positive pull-up signal and a (K)-th negative pull-up signal based on a data transmission distance between the (K)-th data signal driving unit corresponding to the (K)-th pull-up device and the first data output unit, and provides the (K)-th positive pull-up signal to the first positive data transmission line and the (K)-th negative pull-up signal to the first negative data transmission line,
wherein the (L)-th pull-up device generates a (L)-th positive pull-up signal and a (L)-th negative pull-up signal based on a data transmission distance between the (L)-th data signal driving unit corresponding to the (L)-th pull-up device and the second data output unit, and provides the (L)-th positive pull-up signal to the second positive data transmission line and the (L)-th negative pull-up signal to the second negative data transmission line.

14. The image sensor of claim 9, wherein the (K)-th data signal driving unit includes at least one (K)-th sub data signal driving unit and a (K)-th selection circuit,
wherein the (K)-th selection circuit selects an activated digital signal among the at least one (K)-th digital signal as a base signal, the at least one (K)-th sub data signal driving unit generates the at least one (K)-th positive data signal and the at least one (K)-th negative data signal by driving the base signal, and provides the at least one (K)-th positive data signal to the first positive data transmission line and the at least one (K)-th negative data signal to the first negative data transmission line,
wherein the number of the at least one (K)-th sub data signal driving unit is determined based on a data transmission distance between the (K)-th selection circuit and the first data output unit.

15. The image sensor of claim 14, wherein the number of the at least one (K)-th sub data signal driving unit is in proportion to the data transmission distance between the (K)-th selection circuit and the first data output unit.

16. The image sensor of claim 9, wherein the strength of the at least one (K)-th positive data signal and the strength of the at least one (K)-th negative data signal are controlled according to a respective size of a driving transistor included in the (K)-th data signal driving units.

17. The image sensor of claim 9, wherein the strength of the at least one (K)-th positive data signal and the strength of the at least one (K)-th negative data signal are controlled according to a strength of a current source included in the (K)-th data signal driving units.

* * * * *